United States Patent [19]
Ema et al.

[11] Patent Number: 5,812,444
[45] Date of Patent: Sep. 22, 1998

[54] SEMICONDUCTOR MEMORY DEVICE WITH BIT LINE CONTACT AREAS AND STORAGE CAPACITOR CONTACT AREAS

[75] Inventors: Taiji Ema, Kawasaki; Koichi Hashimoto, Yokohama, both of Japan

[73] Assignee: Fujitsu Limited, Kawasaki, Japan

[21] Appl. No.: 669,765

[22] Filed: Jun. 25, 1996

Related U.S. Application Data

[63] Continuation of Ser. No. 323,604, Oct. 17, 1994, abandoned, which is a continuation of Ser. No. 15,884, Feb. 10, 1993, abandoned, which is a continuation of Ser. No. 567,526, Aug. 15, 1990, abandoned.

[51] Int. Cl.$^6$ .................................................. G11C 11/24
[52] U.S. Cl. .............................................. 365/149; 365/63
[58] Field of Search .................................. 365/149, 207, 365/208, 205, 63, 72; 257/296

[56] References Cited

U.S. PATENT DOCUMENTS

| | | | |
|---|---|---|---|
| 4,476,547 | 10/1984 | Miyasaka | 365/208 |
| 4,574,465 | 3/1986 | Rao | 365/149 |
| 4,646,267 | 2/1987 | Shimohigashi et al. | 365/149 |
| 4,651,183 | 3/1987 | Lange et al. | 357/23.6 |
| 4,751,557 | 6/1988 | Sunami et al. | 365/149 |
| 4,763,178 | 8/1988 | Sakui et al. | 357/23.6 |
| 4,831,433 | 5/1989 | Ogura et al. | |
| 4,916,666 | 4/1990 | Fukuhama et al. | 365/207 |
| 4,929,990 | 5/1990 | Yoneda | 357/23.6 G |
| 4,959,698 | 9/1990 | Shinichi | 357/23.6 |
| 4,977,542 | 12/1990 | Matsuda et al. | 365/207 |
| 4,980,733 | 12/1990 | Sugiura | 357/23.6 |
| 4,984,199 | 1/1991 | Yoneda et al. | 365/149 |
| 5,012,309 | 4/1991 | Nakayama | 357/23.6 |
| 5,014,103 | 5/1991 | Ema | 357/23.6 |

FOREIGN PATENT DOCUMENTS

| | | |
|---|---|---|
| 0 031 490A2 | 7/1981 | European Pat. Off. |
| 0 399 531A1 | 11/1990 | European Pat. Off. |
| 61-274357 | 12/1986 | Japan |

OTHER PUBLICATIONS

International Electron Devices Meeting 1988 Technical Digest, "A New Stacked Capacitor DRAM Cell Characterized by a Storage Capacitor on a Bit–line Structure", Kimura et al, Dec. 11–14, 1988, San Francisco, CA, USA pp. 596–599.

IBM Technical Disclosure Bulletin, vol. 24, No. 7B, "Three Rando–Access Memory Cells per Bit Line Contact Memory Design", Ashley et al, Dec. 1981, New York, US, pp. 3815–3816.

Patent Abstracts of Japan, vol. 11, No. 396 (E–568), Dec. 24, 1987 & JP–A–62 158359, Jul. 14, 1987.

S. Yoshikawa et al. "Process Technologies for a High Speed 16 MDRAM with Trench Type Cell", 1989 Symposium on VLSI Technology Digest of Technical Papers, pp. 67 to 68.

S. Fujii et al. "A 45ns 16Mb DRAM with Triple–Well Structure", ISSCC 89 Digest of Technical Papers pp. 248 to 249.

*Primary Examiner*—A. Zarabiu
*Attorney, Agent, or Firm*—Nikaido, Marmelstein, Murray & Oram, LLP

[57] ABSTRACT

A semiconductor memory device includes a plurality of memory cells located at intersections of the word lines and the bit lines, each of the memory cells having a capacitor for storing information and a transfer transistor for reading information from and writing information into the capacitor, the gate of the transfer transistor being connected to a word line, the source of the transfer transistor being connected through a bit line contact area to a bit line, the drain of said transfer transistor being connected through a storage capacitor contact area to the storage electrode of the capacitor. A memory cell pair is formed by two nearby memory cells and these two memory cells of the memory cell pair have a common bit line contact area. In a unit region defined by word line Nos. "i" and "i+1" and bit line Nos. "j" and "j+4", there are provided bit line contact areas and storage capacitor contact areas with a ratio of 1:2 between the number of the bit line contact areas and the storage capacitor contact areas.

16 Claims, 40 Drawing Sheets

Fig. 25A
Fig. 25B
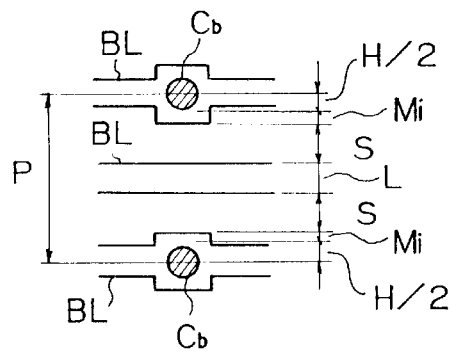
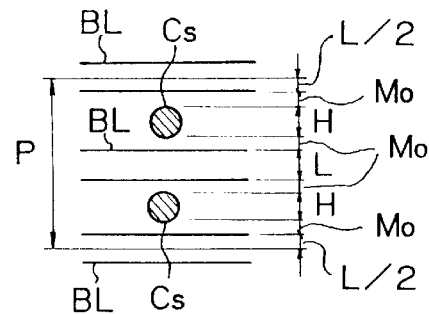
Fig. 26
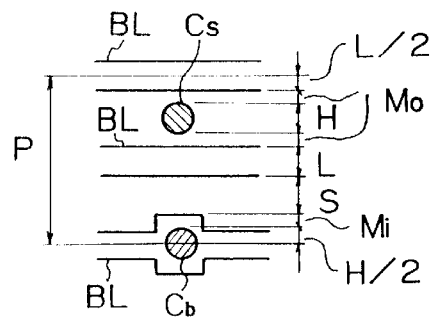
Fig. 27A
ARRANGEMENT ACCORDING TO GENERAL RULE
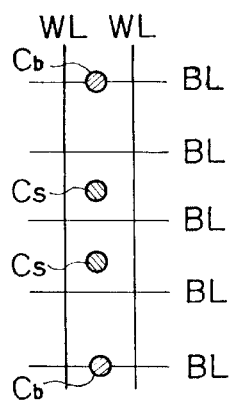
Fig. 27B
IMPOSSIBLE ARRANGEMENT
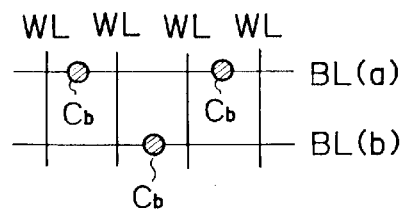

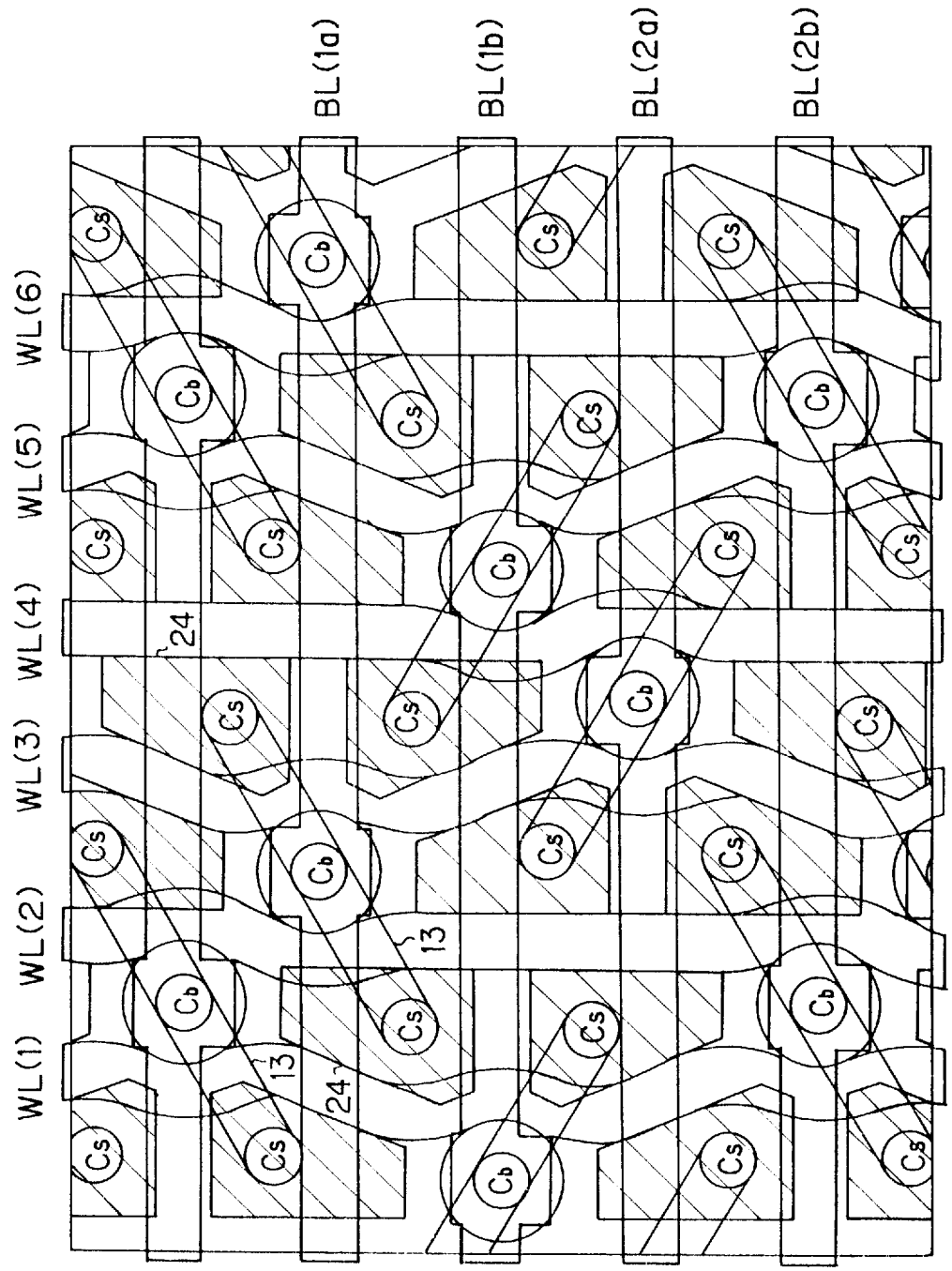

SEMICONDUCTOR MEMORY DEVICE WITH BIT LINE CONTACT AREAS AND STORAGE CAPACITOR CONTACT AREAS

This application is a continuation of application Ser. No. 08/323,604, filed on Oct. 17, 1994, now abandoned, which in turn is a continuation of application Ser. No. 08/015,884, filed Feb. 10, 1993, now abandoned, which in turn is a continuation of application Ser. No. 07/567,526, filed Aug. 15, 1990, now abandoned.

BACKGROUND OF THE INVENTION

1. Field of the Invention

The present invention relates to a semiconductor memory device. The semiconductor memory device according to the present invention is applicable to a storage capacitance type dynamic random access memory (dynamic RAM) in which information is stored in a storage capacitor.

2. Description of the Related Arts

A memory call of a storage capacitance type dynamic RAM, is constituted by a storage capacitor for storing information and a transfer transistor for reading and writing information. The gate of the transfer transistor is connected to a word line, the source of t he transfer transistor is connected to a bit line, and the drain of the transfer transistor is connected to the storage electrode of the storage capacitor.

In a memory cell array of the storage capacitance type dynamic RAM, a plurality of bit lines is arranged in a longitudinal direction and a plurality of word lines is arranged in a lateral direction. The two adjacent bit lines connected to the same sense amplifier at one end of each the two bit lines constitute a folded bit line type arrangement.

A transfer transistor is connected to a bit line through a bit line contact point, also known as a bit line contact area. In the spaces defined by a sequence of bit lines and a sequence of word lines, the drain of a transfer transistor is connected to a storage capacitor electrode through a storage capacitor contact area. Between two adjacent word-lines, the bit line contact areas are arranged for every other bit line. Between two adjacent word lines, the storage capacitor contact areas are arranged in sequence.

Two adjacent memory cells constitute a memory cell pair which has a single common bit line contact area. One side transfer transistor is connected between one side storage capacitor contact area and the bit line contact area, and the other side transfer transistor is connected between the other side storage capacitor contact area and the bit line contact area.

In a prior art arrangement of an array of memory cells of a storage capacitance type dynamic RAM, the storage capacitor contact areas are arranged closely in sequence in a lateral direction, but the bit line contact areas are arranged only for every other bit line in longitudinal direction. Accordingly, the portion where the bit line contact area does not exist constitutes an unused wasteful space. This is not advantageous for realizing a highly integrated storage capacitance type dynamic RAM.

SUMMARY OF THE INVENTION

It is an object of the present invention to provide an improved semiconductor memory device in which the degree of utilization of the space for the arrangement of the bit line contact areas and the storage capacitor contact areas is enhanced, and the rate of the unused wasteful space is reduced, so that a high integration of the semiconductor memory device can be realized.

In accordance with the basic aspect of the present invention, there is provided a semiconductor memory device including a plurality of word lines and a plurality of bit lines intersected by the plurality of word lines, and a plurality of memory cells located at intersections of the word lines and the bit lines, each of the memory cells including a capacitor for storing information and a transfer transistor for reading information from and writing information into the capacitor, the gate of the transfer transistor being connected to a word liner the source of the transfer transistor being connected through a bit line contact area to a bit line, and the drain of the transfer transistor being connected through a storage capacitor contact area to the storage electrode of the capacitor. A memory cell pair is formed by two nearby memory cells and these two memory cells of the memory cell pair have a common bit line contact area. In a unit region defined by word line Nos. "i" and "i+1" and bit line Nos. "j" and "j+4", there are provided bit line contact areas and storage capacitor contact areas with a ratio of 1:2 between the number of the bit line contact areas and the storage capacitor contact areas. "i" is any of the ordinal number of word lines, and "j" is any of the ordinal number of bit lines.

BRIEF DESCRIPTION OF THE DRAWINGS

In the drawings,

FIGS. 25A and 25B illustrate the dimensions of the bit line contact area, the storage capacitor contact area, and the bit line in the prior art memory device;

FIG. 26 illustrates the dimensions of the bit line contact area, the storage-capacitor contact area, and the bit line in the memory device of FIG. 21;

FIGS. 27A and 27B illustrate arrangements of the bit line contact area and the storage capacitor contact area;

FIG. 45 shows the pattern of the memory device of FIG. 44.

DESCRIPTION OF THE PREFERRED EMBODIMENTS

Figure 1:
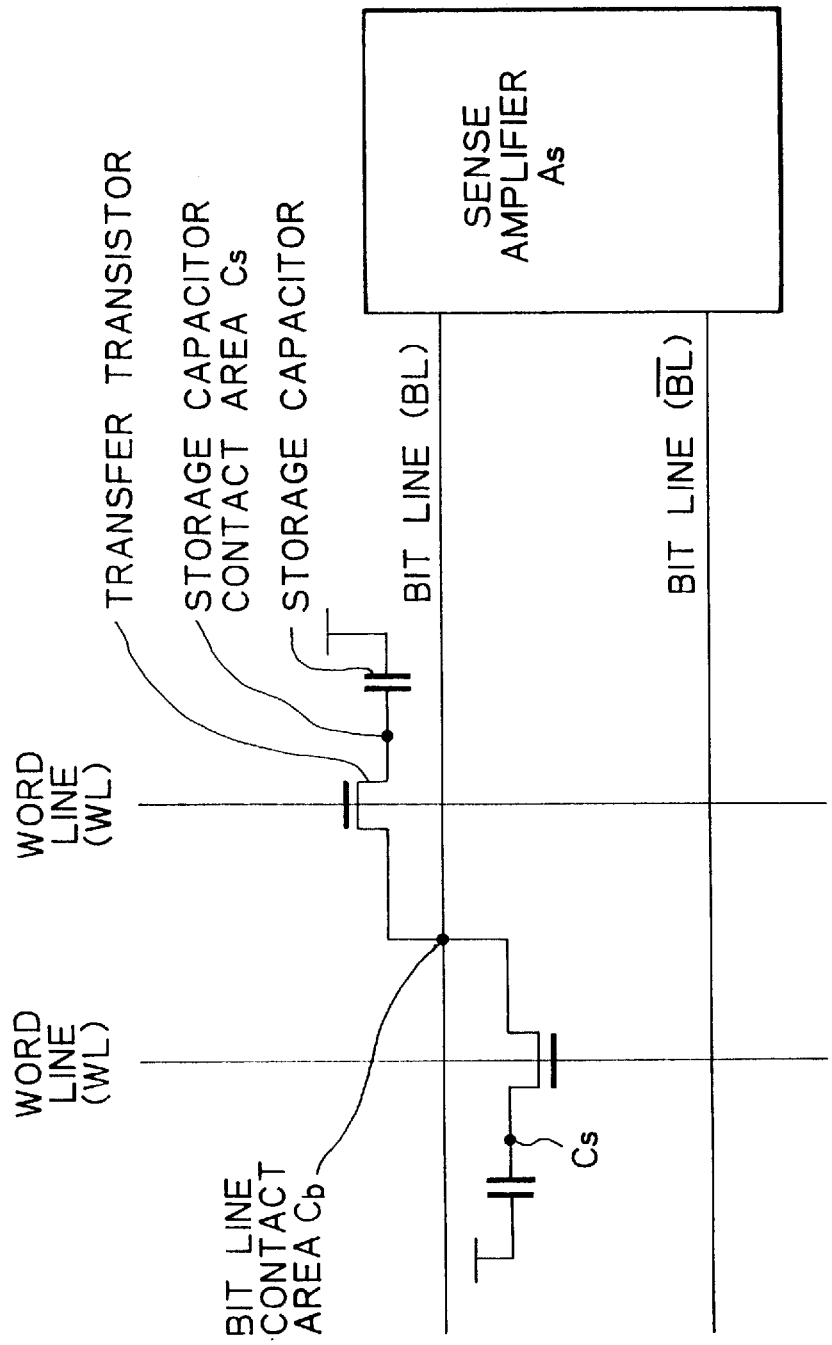
FIG. 1 shows the arrangement of a storage capacitance and a transfer transistor in relation with a folded type bit line connected to a sense amplifier to which the present invention is to be applied.

Before describing the preferred embodiments of the present invention, some of the prior art semiconductor memory devices with bit line contact areas and storage capacitor contact areas are described with reference to FIGS. 1 to 7. In general, a memory cell array of the storage capacitance type dynamic RAM is constituted by word lines (WL), bit lines (BL, BL), sense amplifiers ($A_s$), storage capacitors for storing information, and transfer transistors for reading and writing information from and to the storage capacitors, as shown in FIG. 1.

The gate of the transfer transistor is connected to a word line, the source is connected to a bit line, and the drain is connected to a storage electrode of a storage capacitor.

Figure 2:
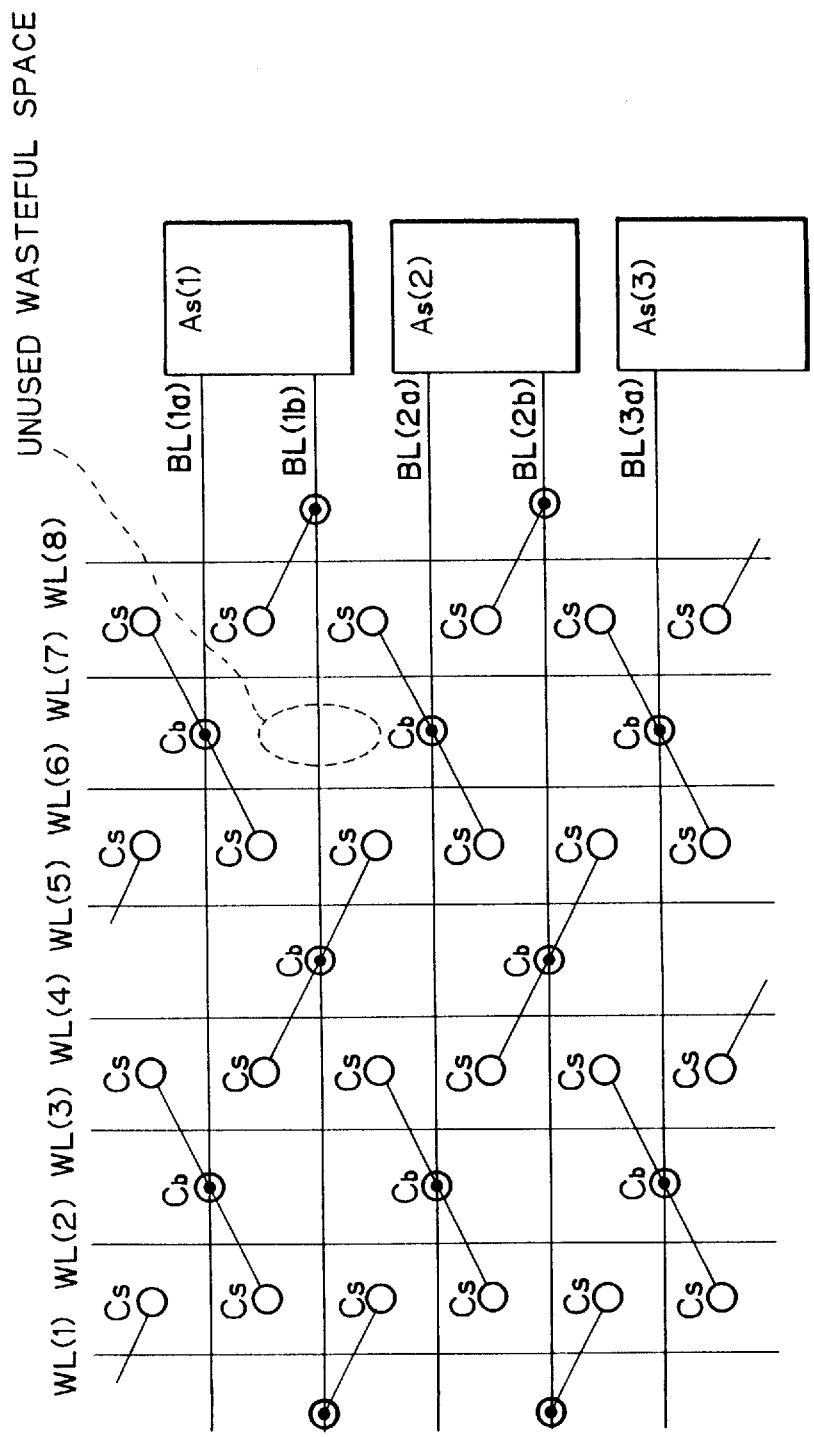
FIG. 2 shows a prior art memory device with bit line contact areas and storage capacitor contact areas.

In the schematic planar pattern of a prior art memory cell array of the storage capacitance type dynamic RAM shown in FIG. 2, a plurality of bit lines BL (1a), BL (1b), . . . are arranged in the longitudinal direction, and a plurality of word lines WL (1), WL (2), . . . are arranged in the lateral direction. The adjacent bit lines EL (1a) and BL (1b), EL (2a) and BL (2b), are connected to sense amplifiers $A_s$ (1), $A_s$ (2), . . . to form bit line pairs of the folded bit line type.

In the spaces defined by the longitudinal bit lines BL (1a), EL (1b), . . . , and the lateral word lines WL (1), WL (2), . . . , drains of the transfer transistors make contact with electrodes of the storage capacitors to form storage capacitor contact areas $C_s$. On the longitudinal bit lines BL (1a), EL (1b), . . . , connections between adjacent transfer transistors make contact with a bit line to form bit line contact areas $C_b$.

A sequence of storage capacitor contact areas $C_s$ are located in the spaces between word lines WL (1) and WL (2). Bit line contact areas $C_b$ are located on every other bit line between word lines WL (2) and WL (3).

The two adjacent memory cells which constitute a memory call pair have in common a bit line contact area $C_b$. A bit line contact area $C_b$ is located on the line connecting storage capacitor contact areas $C_s$ and $C_s$.

Figure 3:
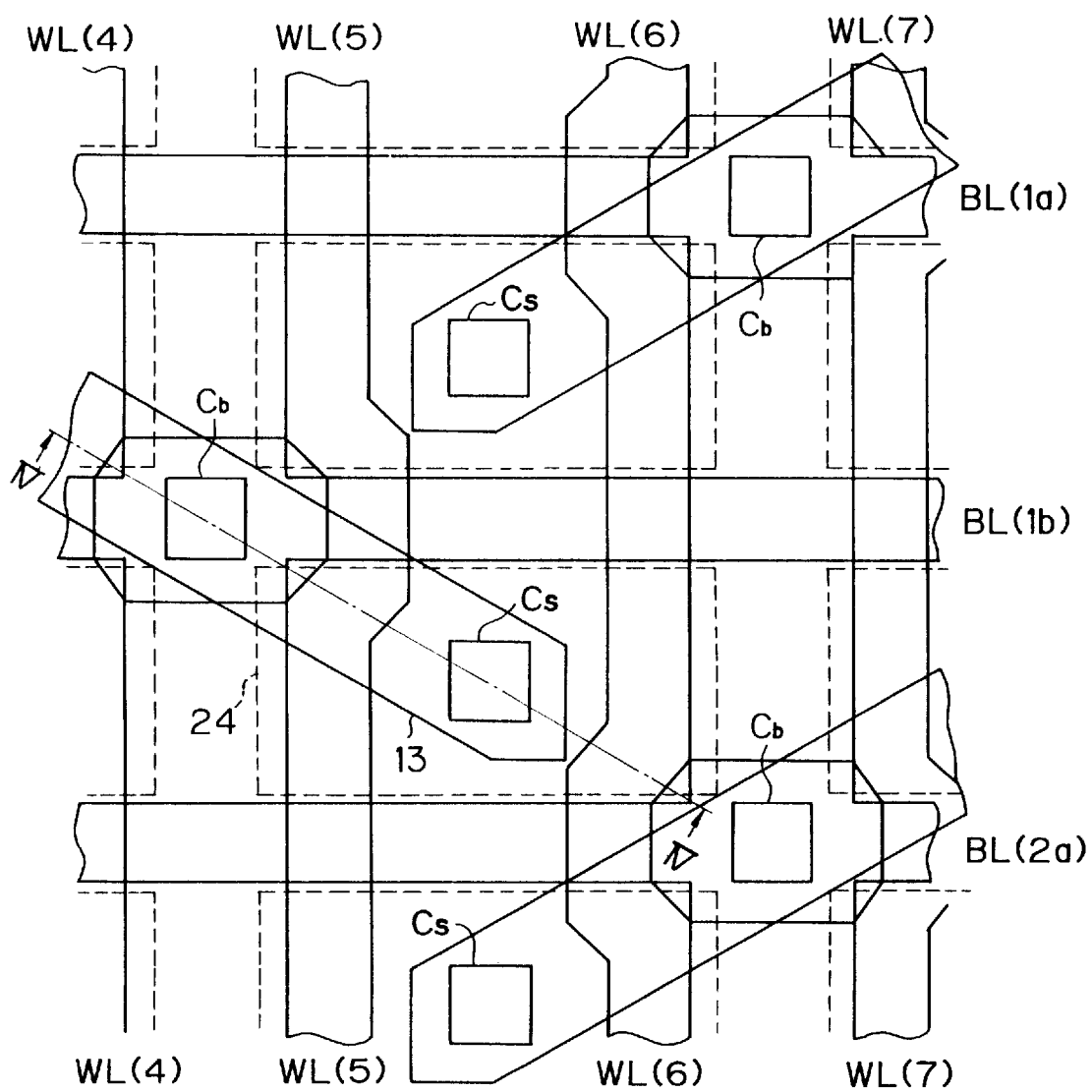
FIG. 3 shows the pattern of the memory device of FIG. 2.
Figure 4:
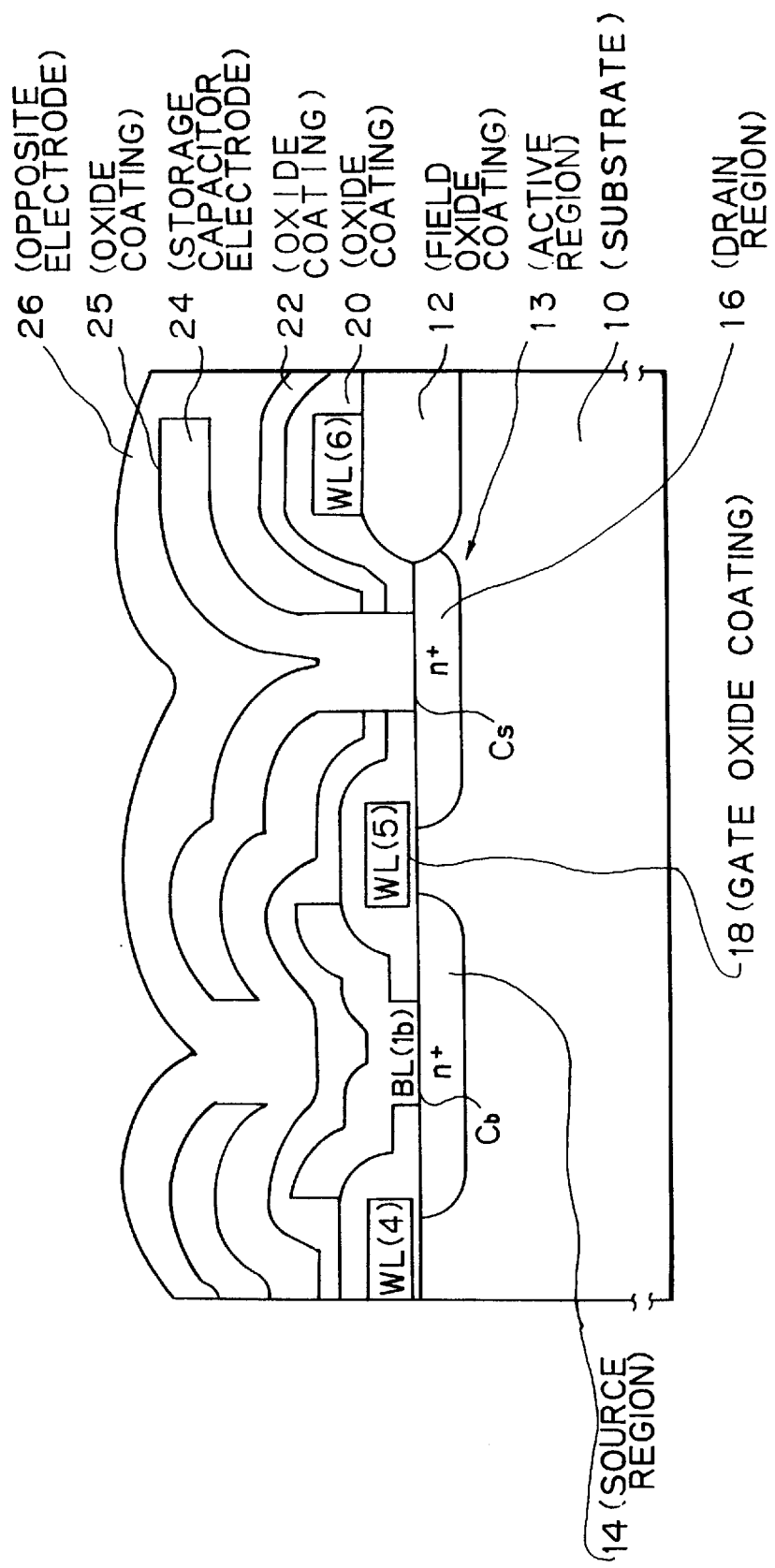
FIG. 4 is a cross-sectional view along line IV—IV of the memory device of FIG. 3.

The top view of the storage capacitance type dynamic RAM of FIG. 2 is shown in FIG. 3, and the cross-sectional view along line IV—IV of FIG. 3 is shown in FIG. 4. The source region 14 and the drain region 16 of the transfer transistor are formed in the active region 13 along the surface of the semiconductor substrate 10 separated by field oxide coating 12. The word line WL (5) is arranged via gate oxide coating 18 between the source region 14 and the drain region 16. The word line WL (4) is arranged via gate oxide coating 18 between the source region 14 and a drain region which is to be provided to the left. The word line (6) is arranged over the field oxide coating 12.

The oxide coating 20 is arranged over the word lines WL (4), WL (5), and WL (6). The bit line BL (1b) contacts the source region 14 through a contact hole formed in the oxide coating 20 to form the bit line contact area $C_b$.

The storage capacitor is formed over the bit line BL (1b) via the oxide coating 22. One electrode 24 of the storage capacitor contacts the drain region 16 to form a storage capacitor contact area $C_s$, while the opposite electrode 26 as the other electrode is formed around the electrode 24 via a thin oxide coating 25.

The electrode 24 is of a rectangular shape having the storage capacitor contact area $C_s$ at the center thereof.

Figure 5:
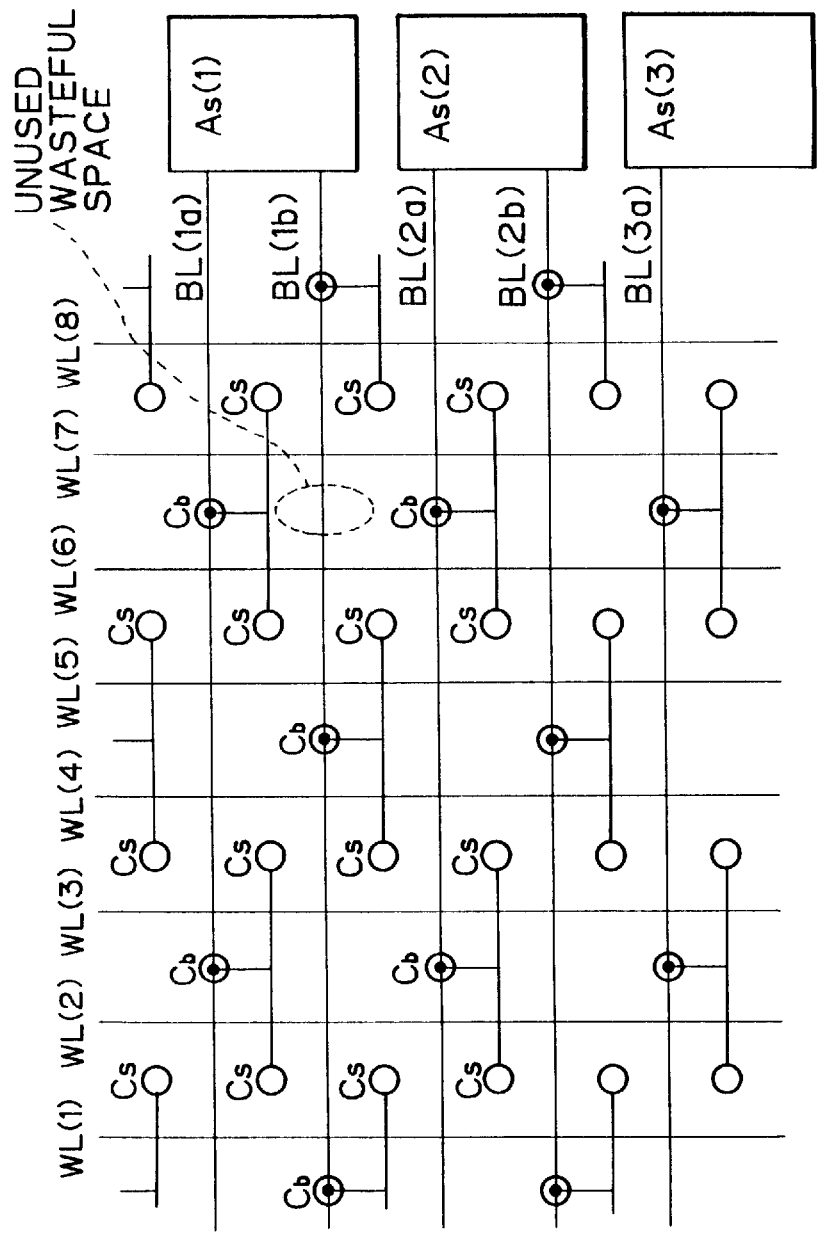
FIG. 5 shows another prior art memory device with bit line contact areas and storage capacitor contact areas.
Figure 6:
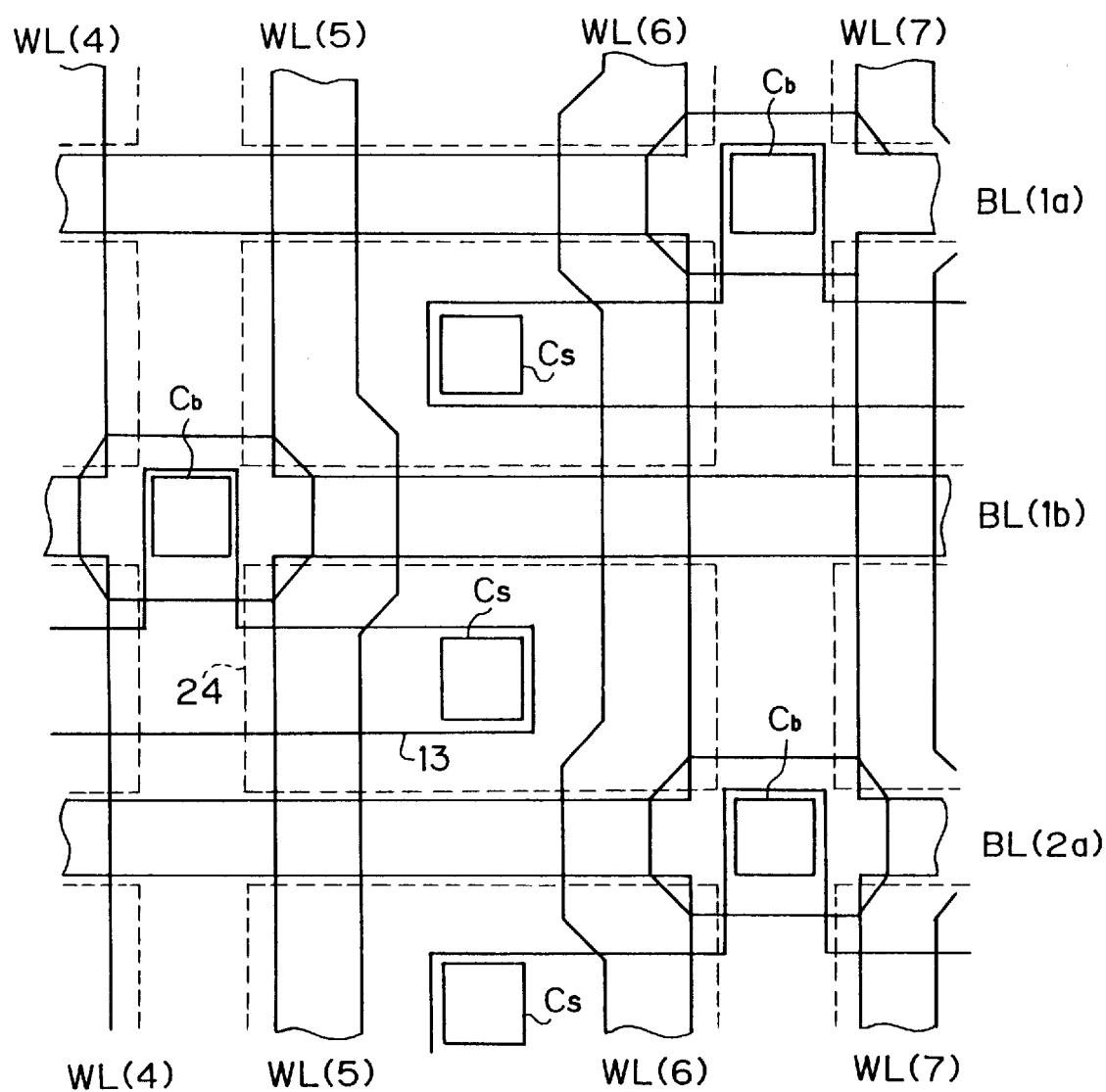
FIG. 6 shows the pattern of the memory device of FIG. 5.

Another prior art storage capacitance type dynamic RAM is shown in FIGS. 5 and 6. In the device of FIGS. 2 and 3, the active region 13 is arranged in the oblique direction with regard to the word line. In the device of FIGS. 5 and 6, the active region 13 has a T shape which is parallel with the bit line and the word line, and the transfer transistor in the active region 13 is perpendicular to the word line.

Figure 7:
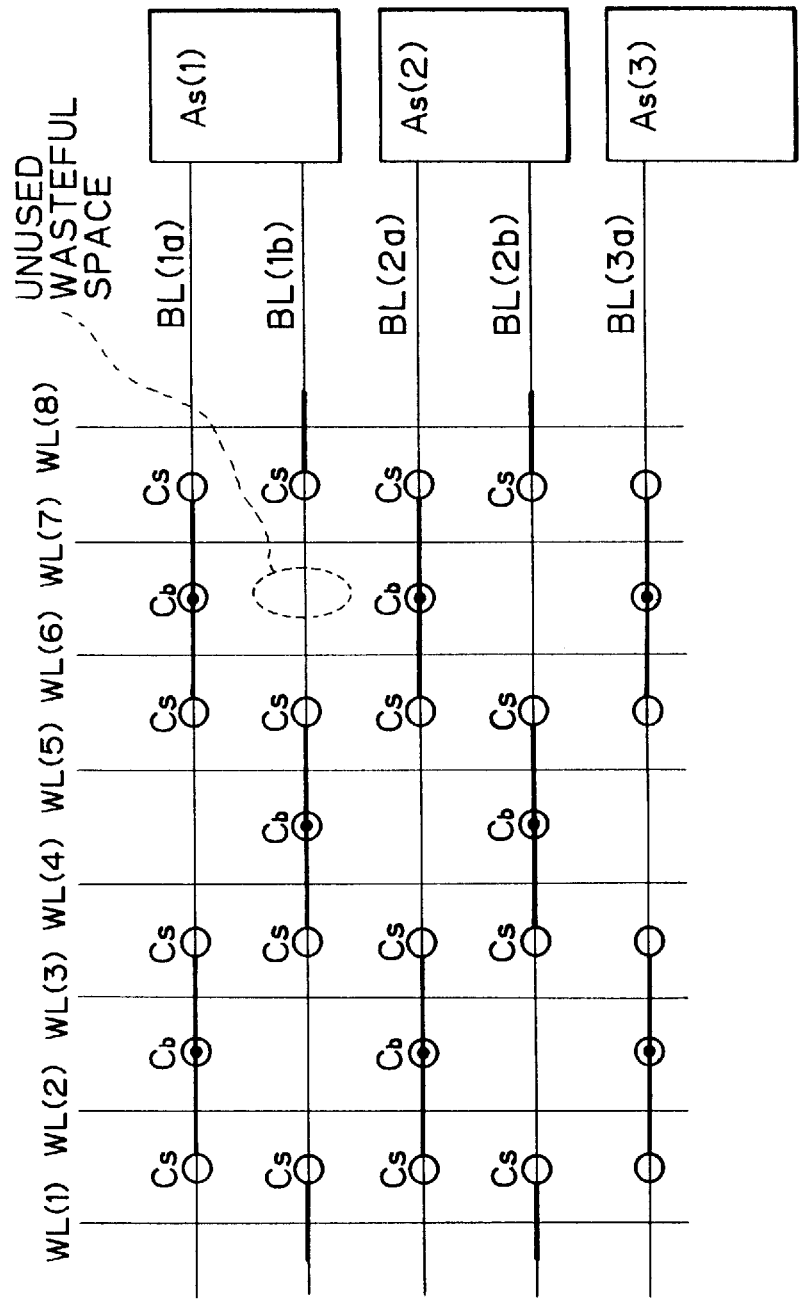
FIG. 7 shows still another prior art memory device with bit line contact areas and storage capacitor contact areas.

Also, another prior art storage capacitance type dynamic RAM is shown in FIG. 7. The bit line contact areas $C_b$ and the storage capacitor contact areas $C_s$ are arranged along a bit line in a manner overlapping the bit line. The active region 13 corresponding to the bit line contact area and the storage capacitor contact areas is arranged along a bit line in a manner over-lapping the bit line.

Figure 8:
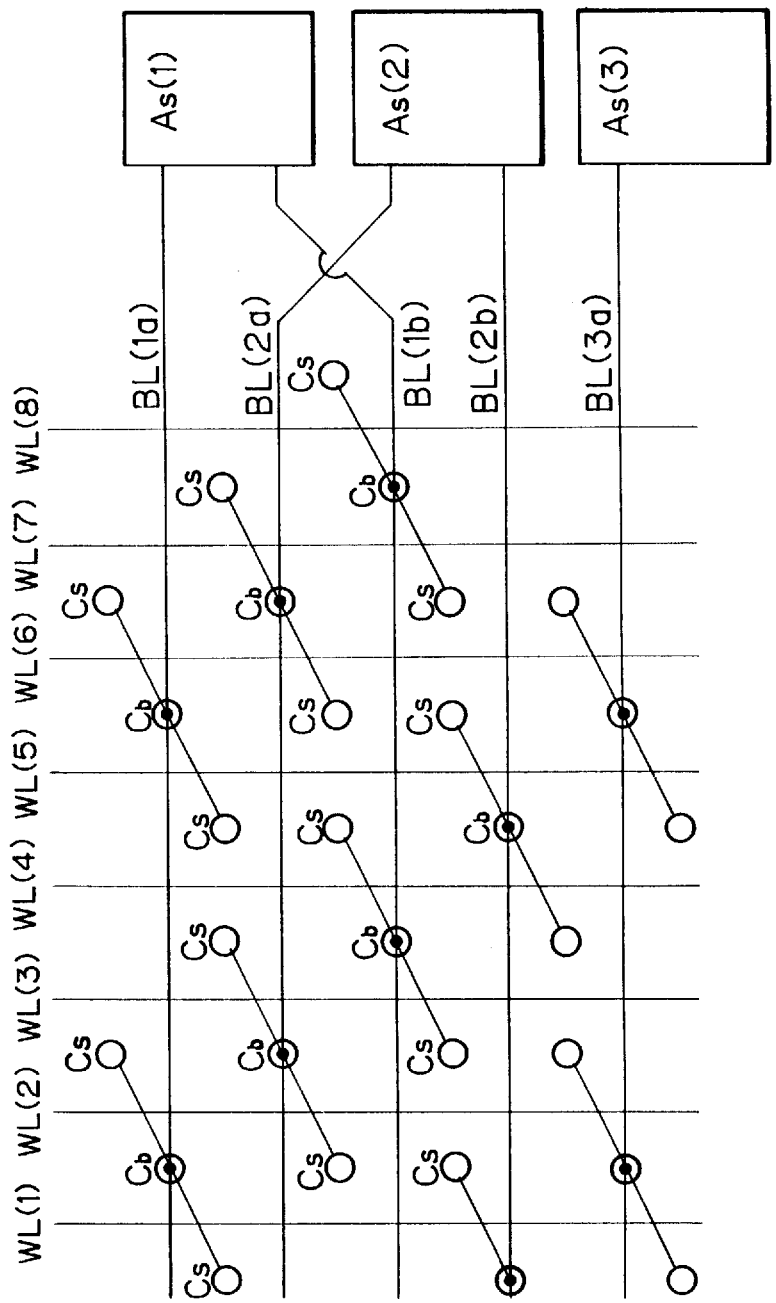
FIG. 8 shows a storage capacitance type dynamic RAM according to an embodiment of the present invention.
Figure 9:
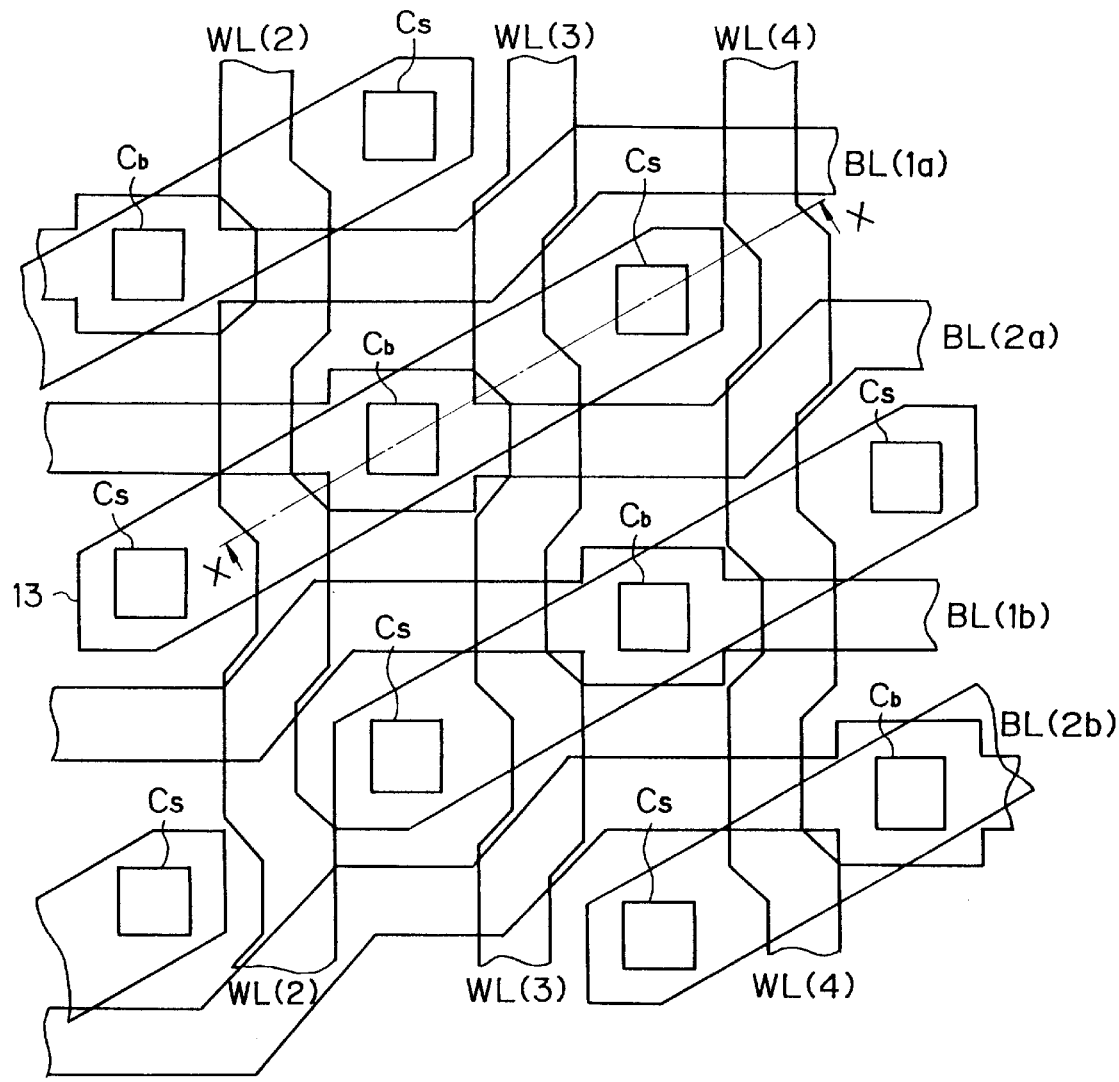
FIG. 9 shows the pattern of the memory device of FIG. 8.
Figure 10:
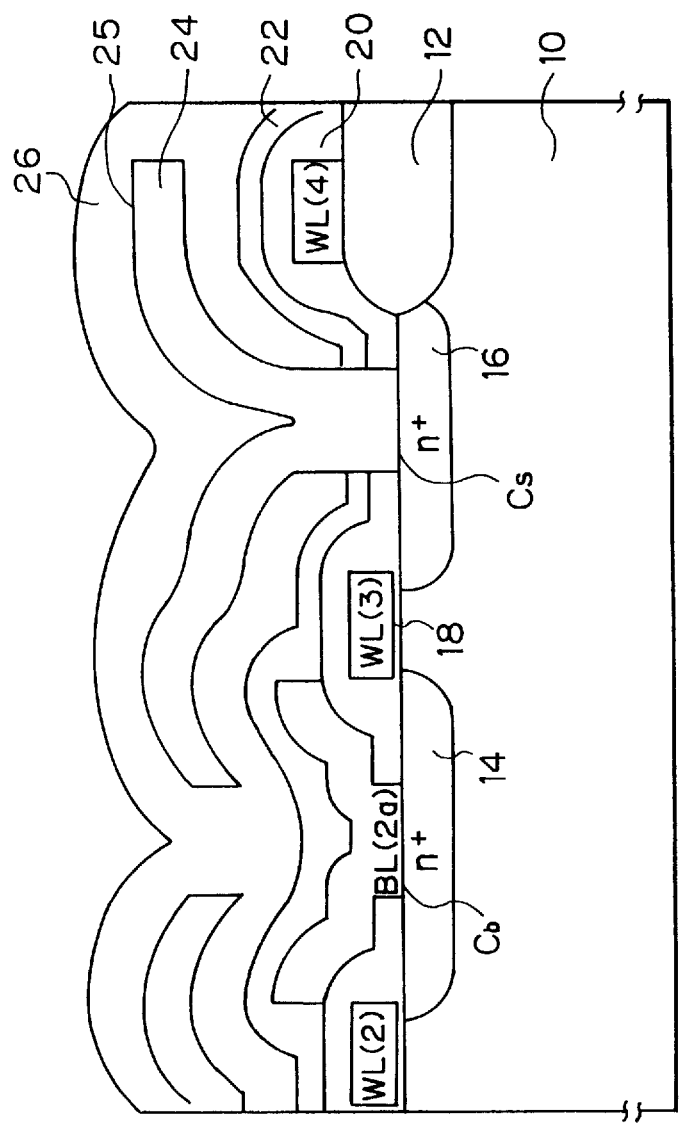
FIG. 10 is a cross-sectional view along line X—X of the memory device of FIG. 9.

A storage capacitance type dynamic RAM according to an embodiment of the present invention is shown in FIGS. 8, 9, and 10. The schematic planar pattern is shown in FIG. 8, the top view of the device in FIG. 9, and the cross-sectional view along line X—X in FIG. 10. In the device of FIG. 8, the first bit line BL (1a) and the third bit line BL (1b) are connected to the sense amplifier $A_s$ (1) to constitute a bit line pair, and the second bit line BL (2a) and the fourth bit line BL (2b) are connected to the sense amplifier $A_s$ (2) to constitute a bit line pair.

Between word lines WL (1) and WL (2), bit line contact area $C_b$ on bit line BL (1a), storage capacitor contact area $C_s$ between bit lines BL (2a) and BL (1b), storage capacitor contact area $C_s$ between bit lines BL (1b) and BL (2b), and bit line contact area $C_b$ on bit line BL (3a) are arranged in sequence. Between word lines WL (2) and WL (3), a sequence of bit line contact area Cb and storage capacitor contact area $C_s$ similar to the case between word lines WL (1) and WL (2), is arranged.

In the device of FIG. 8, the bit line contact area between word lines WL (1) and WL (2) on bit line BL (1a) and the bit line contact area between word lines WL (2) and WL (3) on bit line BL (2a) are located on the opposite sides of word line WL (2). Also, each of the memory cell pairs having a common bit line contact area has the same direction, that is the direction from lower left to upper right.

In the device of FIG. 8, in a unit region defined by word lines Nos. "i" and "i+1", for example WL (2) and WL (3), and bit line Nos. "j" and "j+4", For example BL (1a) and BL (3a), there are provided bit line contact areas and storage capacitor contact areas with a ratio of 1:2 between the number of the bit line contact areas and the storage capacitor contact areas.

As shown in FIG. 9 as a top view and in FIG. 10 as a cross-sectional view, the source region 14 and the drain region 16 of a transfer transistor are formed in the active region 13 separated by the field oxide coating 12 along the surface of the semiconductor substrate 10. The word line WL (3) is arranged between the source region 14 and the drain region 16 via the gate oxide coating 13. The word line WL (2) is arranged between the source region 14 and the drain region to be provided to the left thereof via the gate oxide layer 19. The word line WL (4) is arranged over the oxide coating 12. The oxide coating 20 is arranged over the word lines WL (2), WL (3), and WL (4). The bit line BL (2a) contacts the source region 14 through the bit line contact area $C_b$. A storage capacitor is constituted over bit line BL (2a) via oxide coating 22. One electrode 24 as a storage electrode of a storage capacitor contacts the drain region 16 through the storage capacitor contact area $C_s$, while the opposite electrode 26 as the other electrode is formed around the electrode 14 via thin oxide coating 25. In a modified embodiment, the cross-sectional configuration of the electrode 24 of the storage capacitor can be a multiple layer configuration, i.e., a fin-like configuration.

An analysis of the arrangement of the storage capacitance type dynamic RAM of FIG. 8 will be described with reference to FIGS. 11, 12, 13, and 14 as follows.

Figure 11:
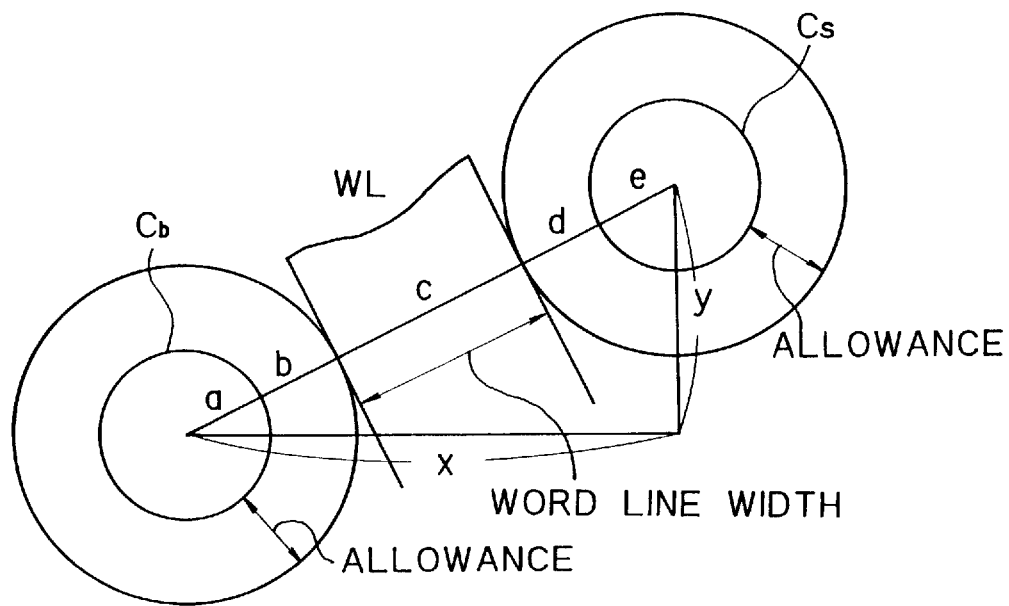
FIGS. 11 to 14 illustrate the dimensions and spatial arrangement of the bit line contact areas and the storage capacitor contact areas of the memory device of FIG. 8.
Figure 12:
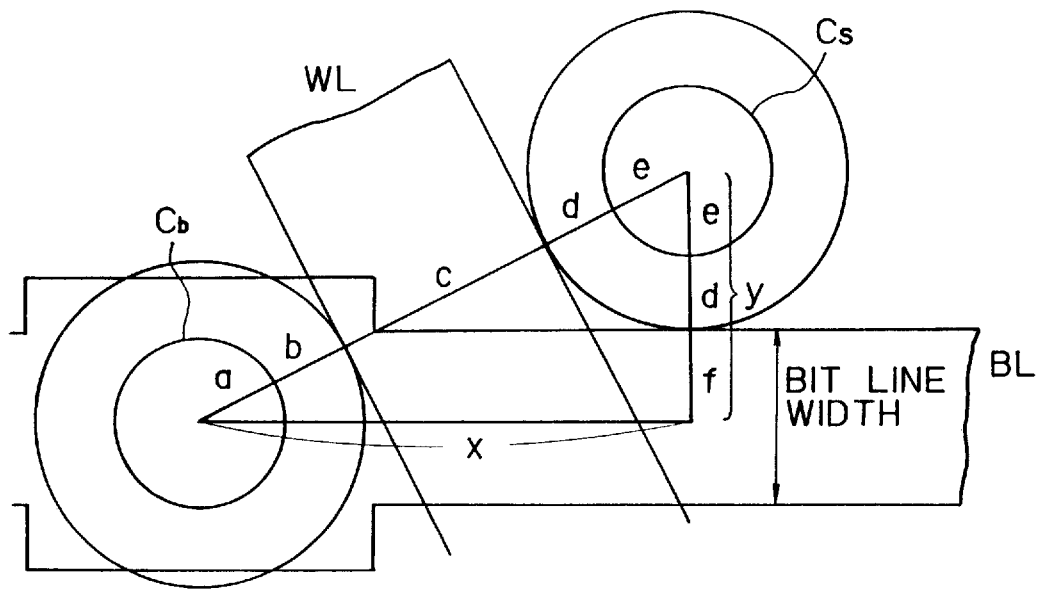

The X-directional distance x and Y-directional distance y between a bit line contact area $C_b$ and a storage capacitor contact area $C_s$ are determined in accordance with a first condition that a word line WL passes between the bit line contact area $C_b$ and the storage capacitor contact area C. (FIG. 11), and a second condition that the storage capacitor contact area $C_s$ is apart from the bit line EL with which the bit line contact area $C_b$ is formed (FIG. 12).

It is assumed that the radius of the bit line contact area $C_b$ is "a", its width allowance is "b", the width of the word line WL is "c", the radius of the storage capacitor contact area is "e", and its width allowance is "d". Then, the distance between the bit line contact area $C_b$ and the storage capacitor contact area $C_s$ is given from the first condition to be "a+b+c+d+e"(FIG. 11).

It is assumed that the width of the bit line EL is "2f". Then, the Y-directional distance y between the bit line contact area $C_b$ and the storage capacitor contact area $C_s$ is given from the second condition to be "e+d+f".

The X-directional distance x' and the Y-directional distance y' between the nearest bit line contact areas are determined in accordance with a third condition that a word line WL passes between the bit line contact areas and a fourth condition that each of the bit line contact areas contacts a different bit line.

From the third condition the distance between the bit line contact areas is given to be "a+b+c+b +a"(FIG. 12).

Figure 13:
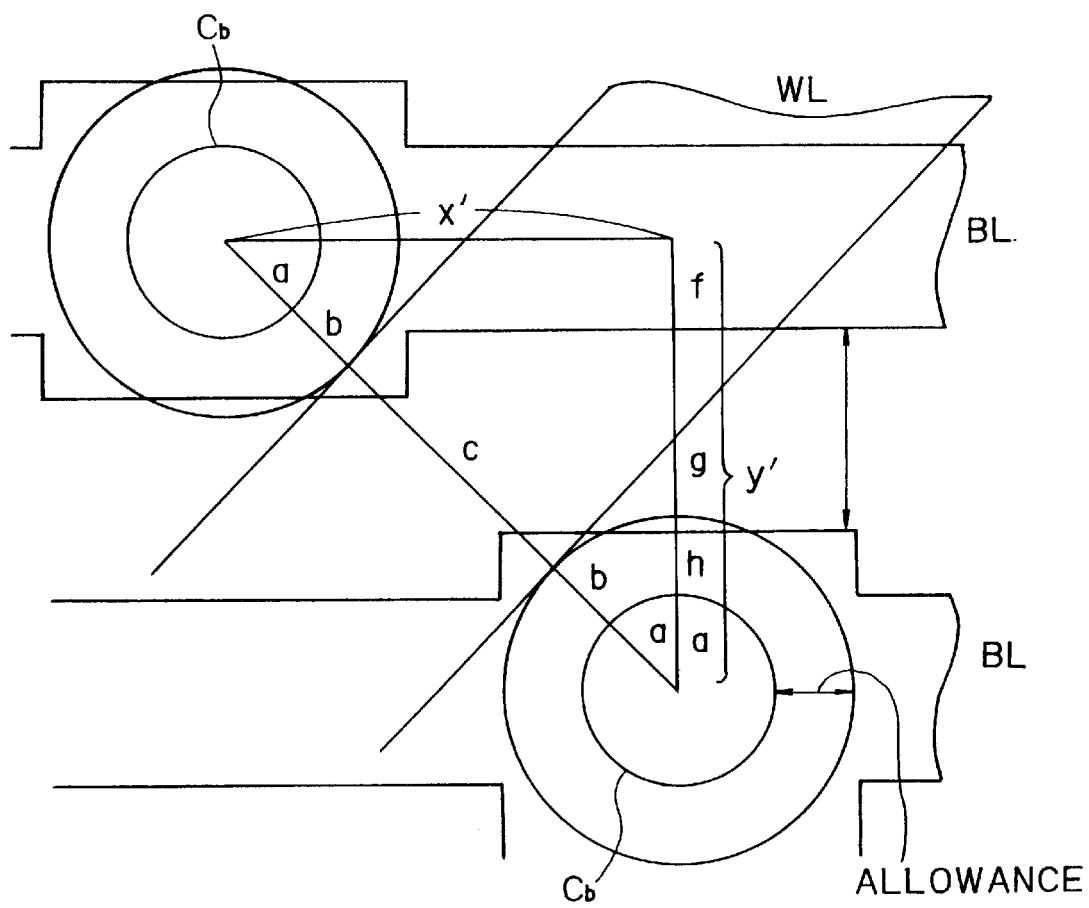

It is assumed that the allowance of width of the bit line contact area is "h". Then, the Y-directional distance y, between the bit line contact areas is given from the fourth condition to be "f+g+h+a" (FIGS. 13).

The x-directional distance x" and the Y-directional distance y" between the nearest storage capacitor contact areas are determined in a similar manner.

Figure 14:
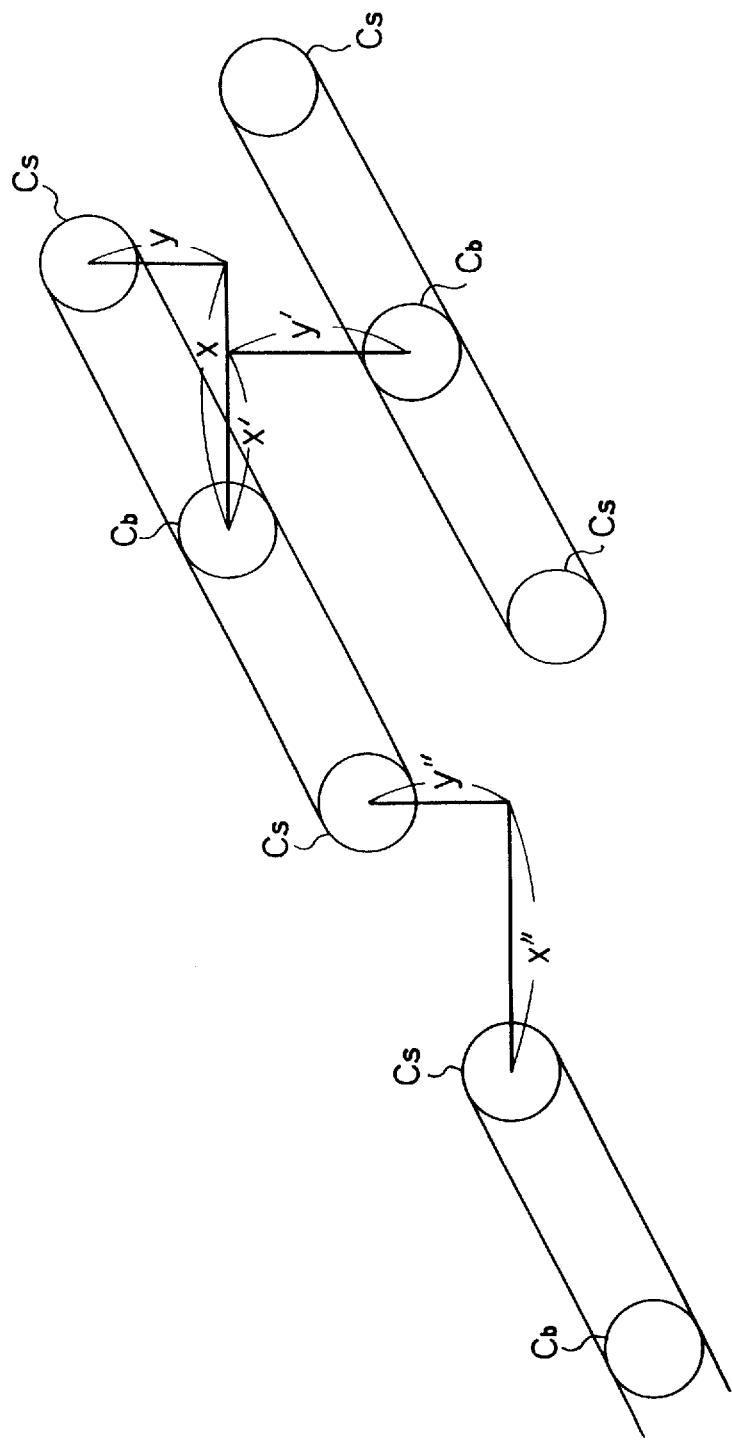

From the above, the arrangement of the bit line contact areas $C_b$ and the storage capacitor contact areas $C_s$ is given as shown in FIG. 14.

A calculation of the area of the memory cell will be carried out, for example, as follows. It is assumed that the diameter of the contact hole is 0.6 µm, the width of the wiring conductor is 0.5 µm, the allowance of the contact hole and the external wiring conductor is 0.3 µm, the allowance of the contact hole and the wiring conductor contacting the contact hole is 0.2 µm, and the gap between the wiring conductors is 0.5 µm. The dimensions are given as follows,

| a = e = 0.3 µm | b = d = 0.3 µm |
|---|---|
| c = 0.5 µm | f = 0.25 µm |
| g = 0.5 µm | h = 0.2 µm |

$$x = [(a+b+c+d+e)^2 - (e+d+f)^2]^{1/2}$$
$$= [(0.3+0.3+0.5+0.3+0.3)^2 - (0.3+0.3+0.25)^2]^{1/2}$$
$$= 1.472 \,\mu m = 1.5 \,\mu m$$
$$y = e+d+f$$
$$= 0.3+0.3+0.25 = 0.85 \,\mu m$$
$$x' = [(a+b+c+b+a)^2 - (f+g+h+a)^2]^{1/2} = [(0.3+0.3+0.5+0.3+0.3)^2 - (0.25+0.5+0.2+0.3)^2]^{1/2} = 1.152 \,\mu m$$
$$\approx 1.2 \,\mu m$$
$$y' = f+g+h+a = 0.25+0.5+0.2+0.3$$
$$= 1.25 \,\mu m$$

Figure 15:
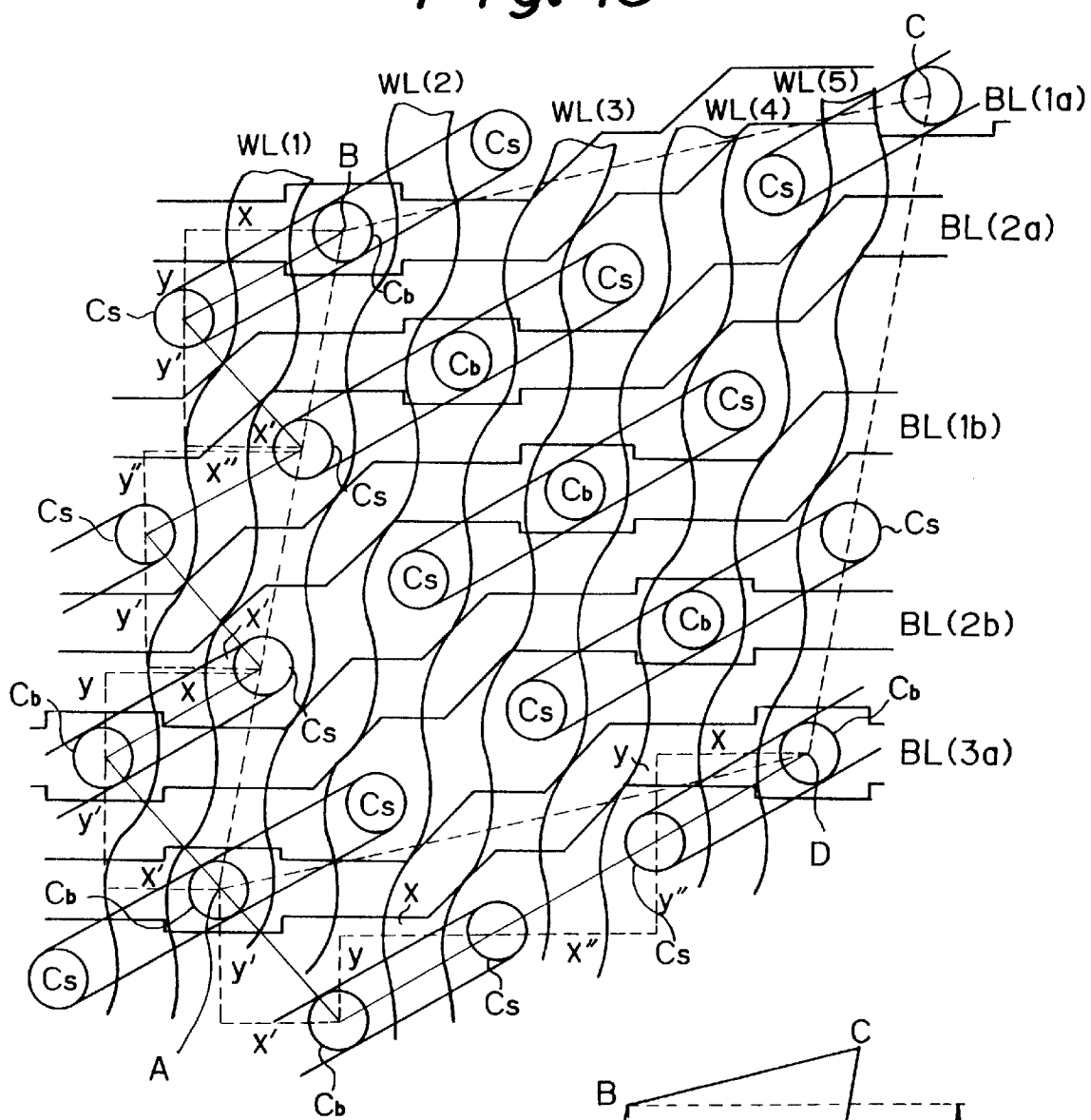
FIG. 15 and 16 illustrate the dimensions and spatial arrangement of the patterns of the memory device of FIG. 8.

An arrangement of the memory cell array based on the values obtained by the above described calculations is shown in FIG. 15. Four memory cell pairs, i.e., eight memory cells, constitute a unit pattern defined by a parallelogram ABCD. In the planar pattern of the device, this unit pattern is repetitively arranged.

Figure 16:
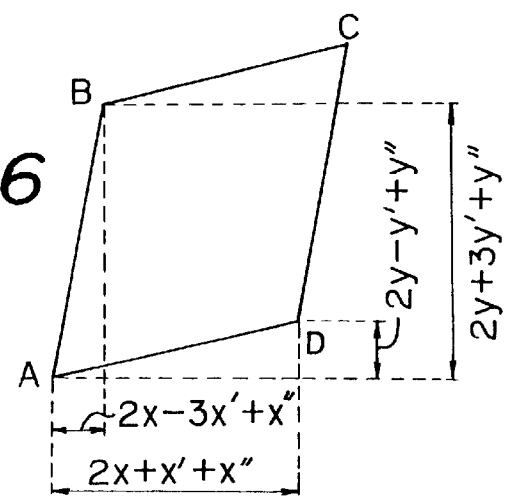

The configuration of the parallelogram ABCD is illustrated in FIG. 16. The X-directional dimension between apexes A and B is "2x−3x''", and that between apexes A and D is "2x+x'+x''". The Y-directional dimension between apexes A and B is "2y+3y'+y''", and that between apexes A and D is "2−y'+y''". Accordingly, the X-directional shift of the laterally running word line WL is "2x−3x'+x''", and the Y-directional shift of the longitudinally running bit line BL is "2y−y'+y''". Then, the area of the unit pattern ABCD is calculated as follows.

$$(2x+x'+x'')(2y+3y'+y'')$$

$$(2x-3x'+x'')(2y-y'+y'')$$

Since eight memory cells constitute a unit pattern ABCD, the area S of a memory cell is one eight of the area of the unit pattern ABCD.

For the convenience of calculation, it is assumed that there is no shift of a word line WL, In this case, it is required that 2x−3x'+x''=0, and hence the values of x'' and y'' are as follows.

$$x'' = -2x + 3x'$$
$$= (-2)(1.5) + (3)(1.2)$$
$$= 0.6 \mu m$$
$$y'' = [(2e + 2d + c)^2 - (x'')^2]^{1/2}$$
$$= 1.59 \mu m$$

Accordingly, the area of a memory cell is as follows.

$$S = 4.224 \ \mu m^2$$

In order to eliminate a shift of word line WL, it is possible to assume that $x=x'=x''$. In this case, the maximum value between x, x', and x'' is used as follows $$x = x'x'' = 1.5 \ \mu m$$
$$y = y'' = 0.85 \ \mu m$$
$$y' = 1.25 \ \mu m$$

Accordingly, the area of a memory cell is as follows.

$$S = 4.725 \ \mu m^2$$

In the arrangement of the prior art memory cell, the area of a memory cell is calculated to be 5.1 $\mu m^2$.

As a result of the comparison based on the above-described calculation, the area of a memory cell according to the device of FIG. 8 can be more than 10% less than that according to the prior art.

Figure 17:
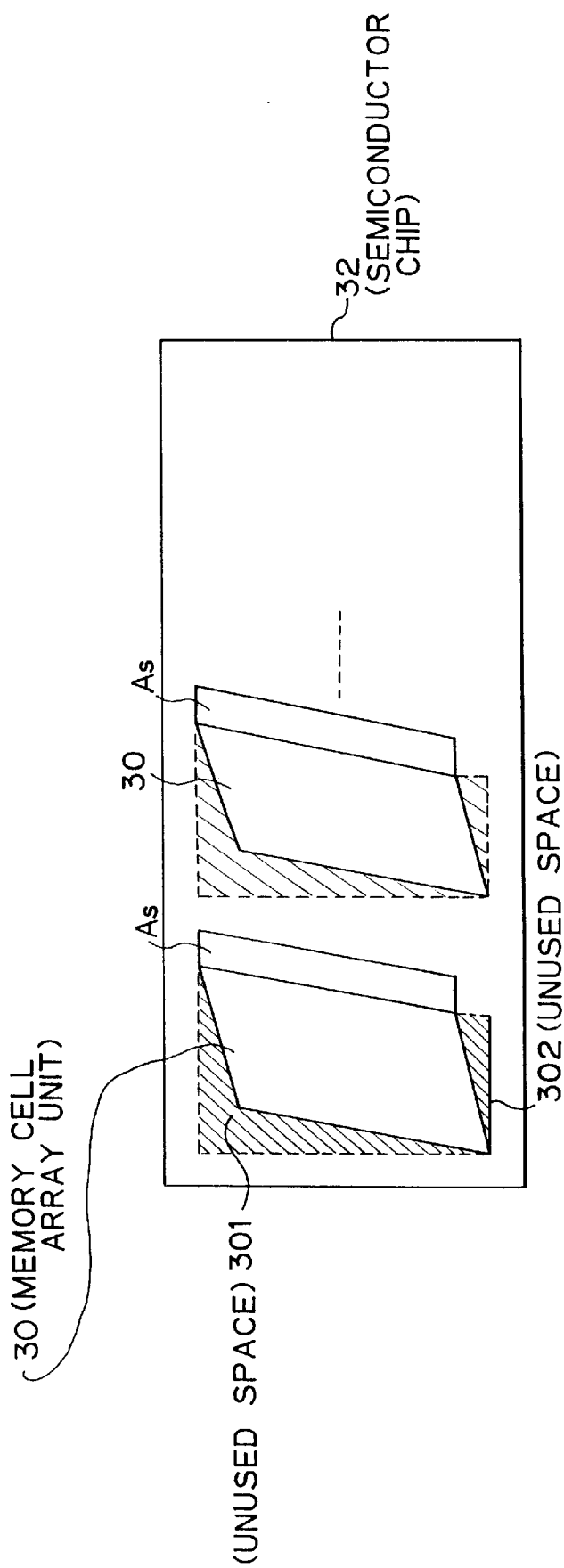
FIG. 17 to 19 illustrate the arrangement of memory cell arrays in a semiconductor chip for the memory device of FIG. 8.
Figure 18:
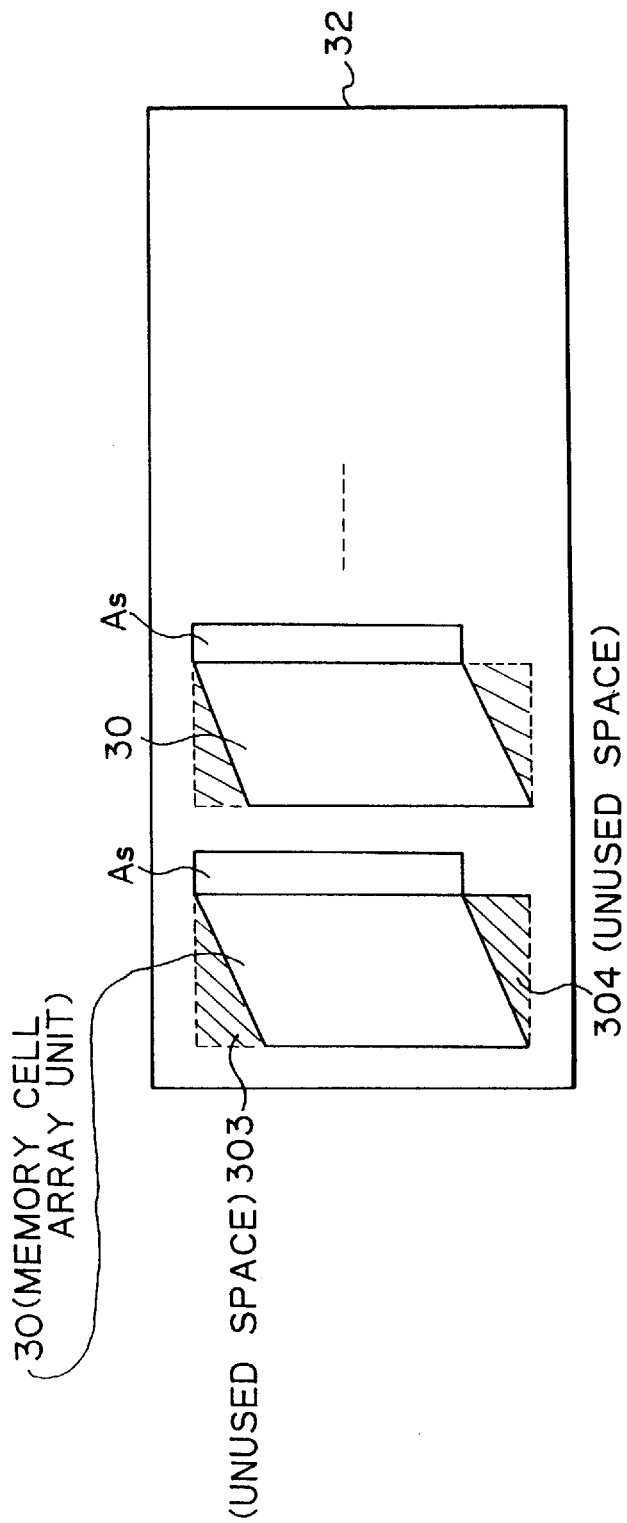
Figure 19:
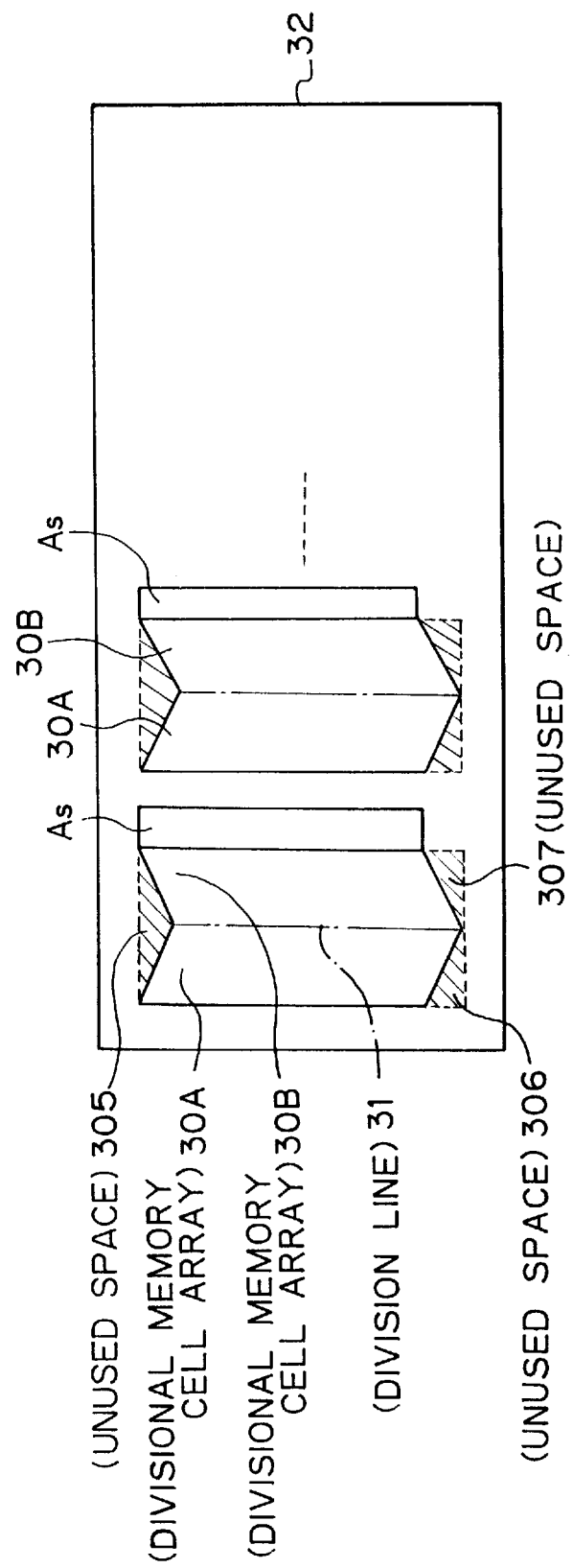

Possible arrangements of the memory cell array of the device of FIG. 8 in a semiconductor chip are shown in FIGS. 17, 18, and 19.

In the arrangement shown in FIG. 17 where the X-axis and Y-axis of the memory cell array 30 are in parallel with the two sides of the semiconductor chip 32, respectively, unused spaces 301 and 302 are formed around the memory cell array unit 30, and thus this arrangement is not considered to be advantageous.

In a desirable arrangement shown in FIG. 18, the longer side of the parallelogram of the memory cell array unit 30 is set to be parallel with one side of the semiconductor chip 32. The arrangement shown in FIG. 18 is better than that in FIG. 17, since the area of the unused spaces 303 and 304 is less than in the case of FIG. 17.

In a more desirable arrangement shown in FIG. 19, the memory cell array unit 30 is divided into two parts 30A and 30B by the central division line 31 to constitute a mirror image symmetry of the parts 30A and 30B, and the central division line 31 is made parallel with one side of the semiconductor chip 32. The arrangement shown in FIG. 19 is better than that in FIG. 18, since the area of the unused spaces 305, 306, and 307 is less than in the case of FIG. 18.

Figure 20:
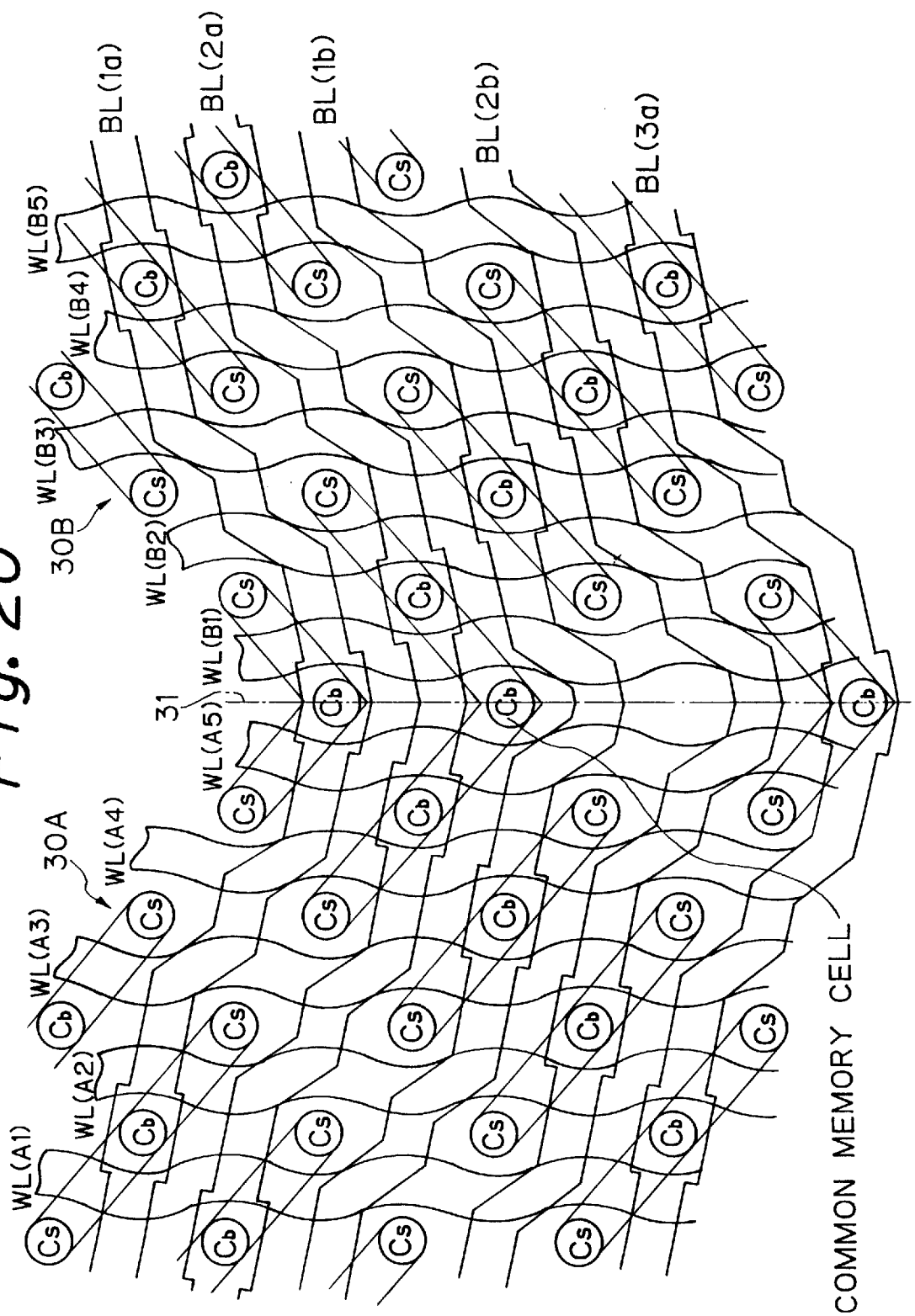
FIG. 20 shows the pattern of the memory cell array in the case of FIG. 19.

The details of the arrangement of the memory cell array shown in FIG. 19 in the vicinity of the division line 31 are shown in FIG. 20. In the arrangement shown in FIG. 20, there exists a common memory cell which is to be owned by both the divisional memory cell arrays 30A and 30B. In this case, the word line BL (B1) in the divisional memory cell array 30B is maintained always in an OFF state so that the common memory cell is treated as belonging to the divisional memory cell array 30A.

In a modified embodiment, the number of divisions of the memory cell array 30 can be more than two, for example, integer multiples of two.

Also, in a modified embodiment, the direction of the memory cell array pair can be from upper left to lower right, instead of from lower left to upper right as in the case of FIG. 8.

Figure 21:
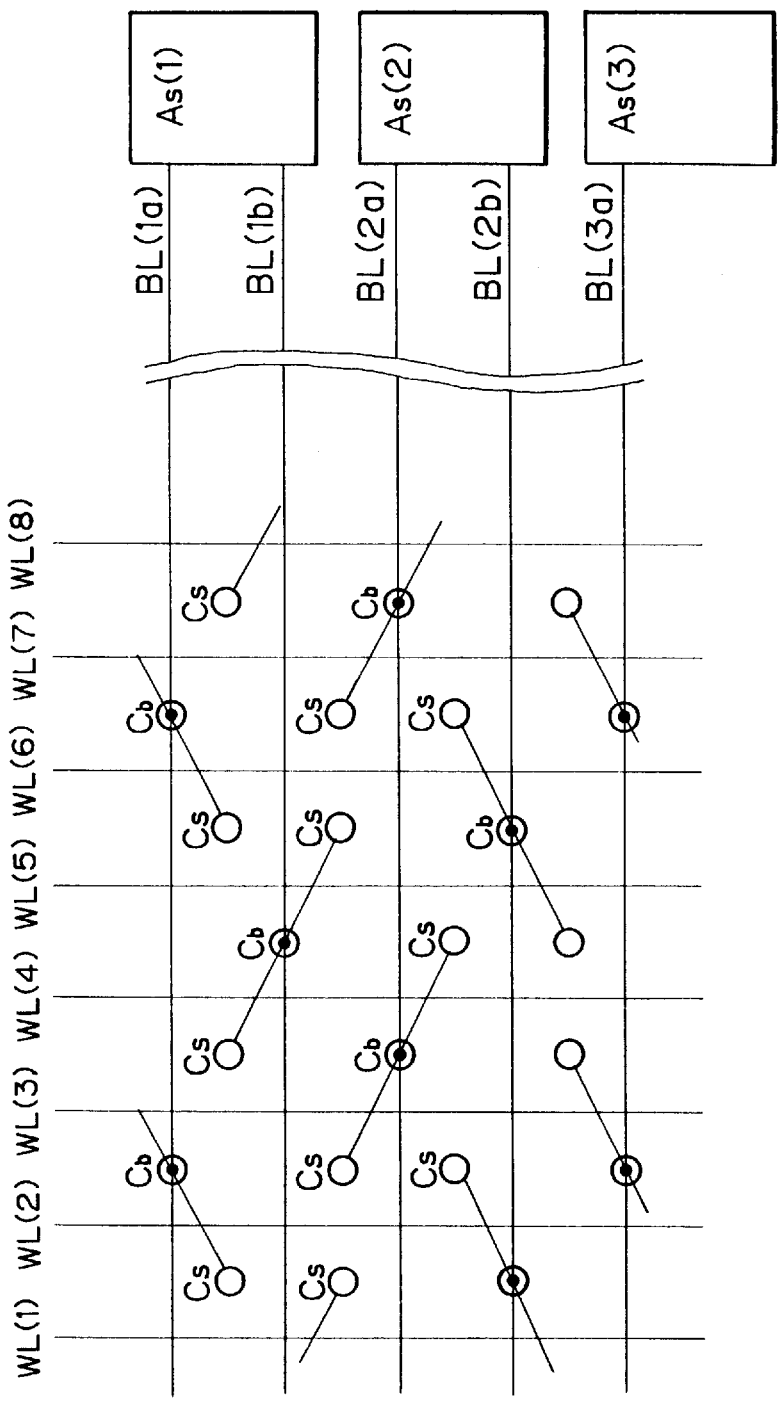
FIG. 21 shows a storage capacitance type dynamic RAM according to another embodiment of the present invention.
Figure 22:
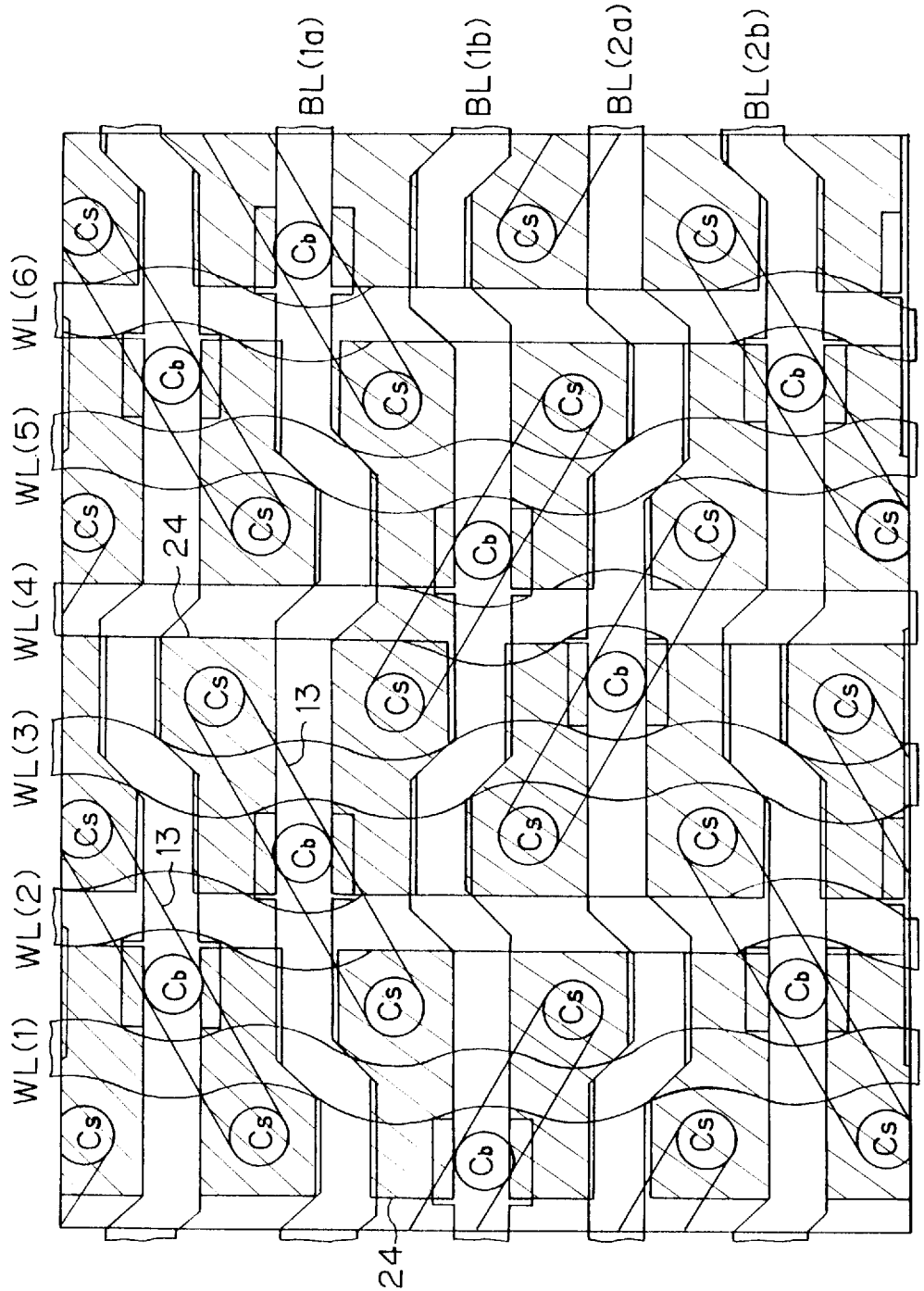
FIGS. 22 to 24 show examples of the pattern of the memory device of FIG. 21.
Figure 23:
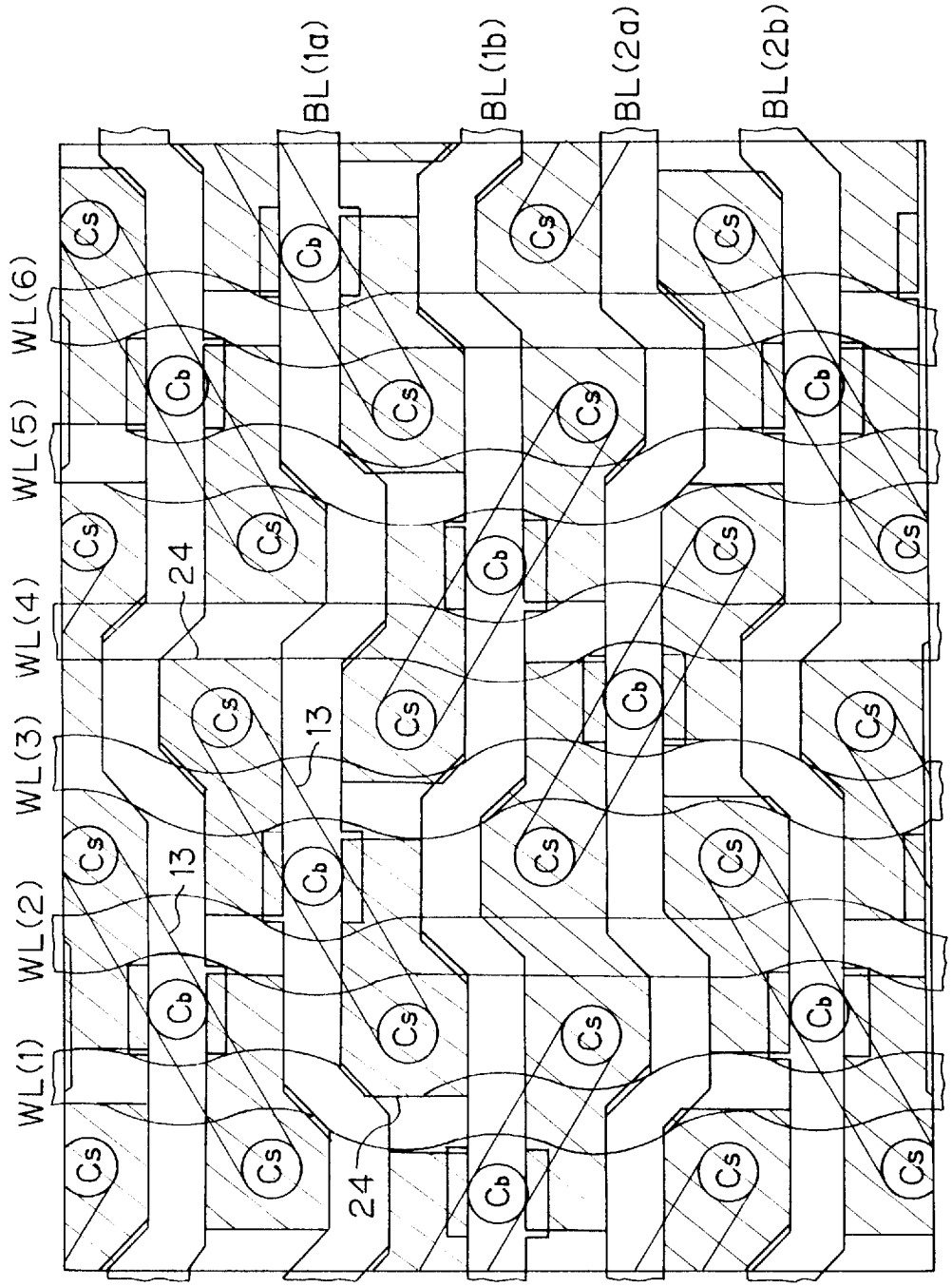
Figure 24:
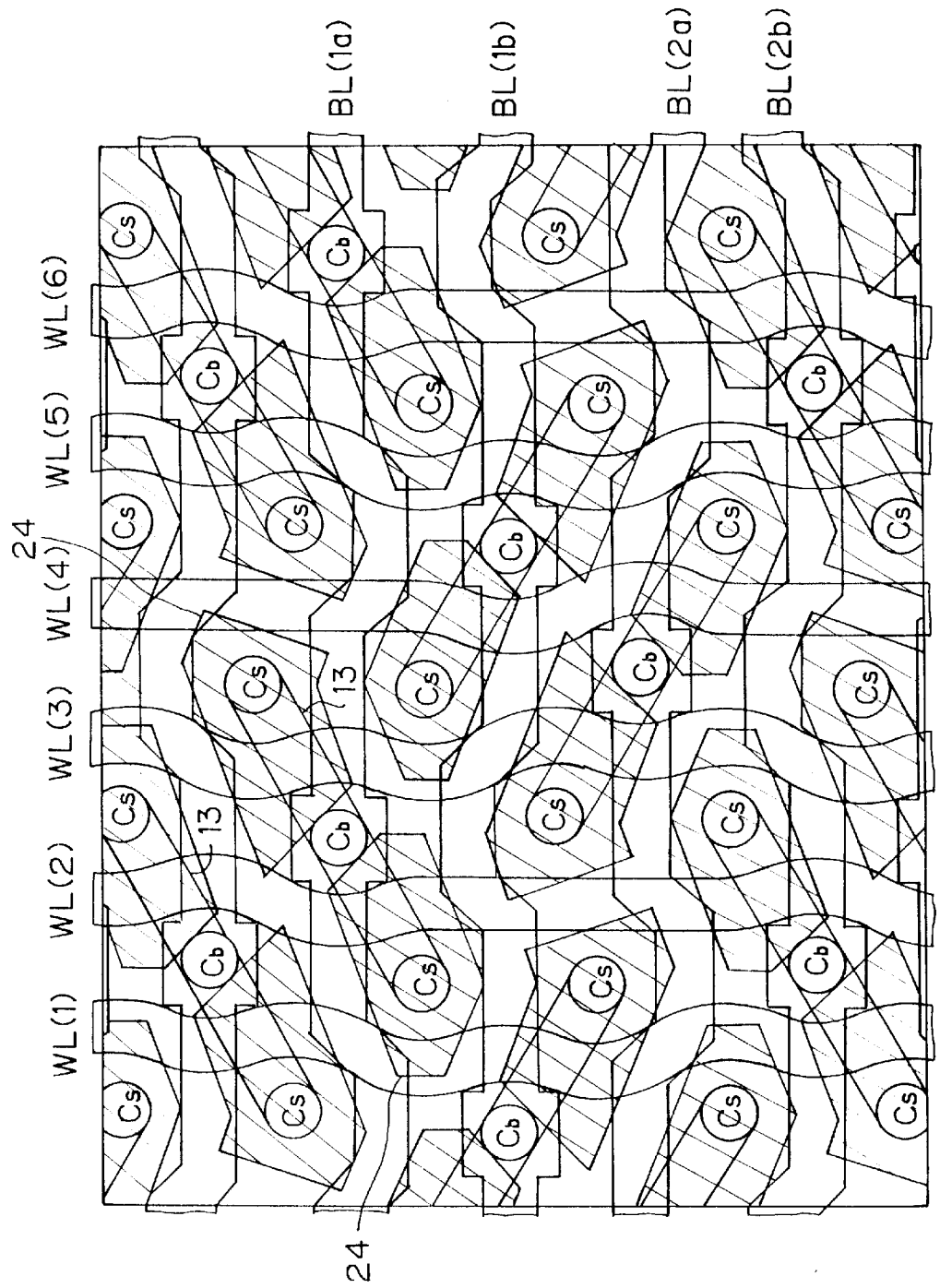

A storage capacitance type dynamic RAM according to another embodiment of the present invention is shown in FIGS. 21, 22, 23, and 24. The schematic planar pattern is shown in FIG. 21, and the top views of the device are shown in FIGS. 22, 23, and 24. In the pattern of FIG. 21, the word lines WL (1), WL (2), WL (3), . . . are arranged in the lateral direction in sequence, and the bit lines BL (1a), BL (1b), BL (2a), BL (2b), . . . are arranged in the longitudinal direction in sequence. The bit lines BL (1a) and BL (1b) are connected to the sense amplifier $A_s$ (1), the bit lines BL (2a) and BL (2b) are connected to the sense amplifier $A_s$ (2), and so on.

In the device shown in FIG. 21, between the two adjacent word lines, bit line contact areas are located on a first bit line, a fifth bit line, and so on, and storage capacitor contact areas are located between the second and third bit lines, between the third and fourth bit lines, and so on.

In the device shown in FIG. 21, the directions of the memory cell pairs are arranged as follows. With regard to the bit line contact areas between first and third word lines, the direction of the memory cell pair having the bit line contact area at the center thereof is from lower left to upper right; with regard to the bit line contact areas between third and fifth word lines, the direction of the memory cell pair having the bit line contact area at the center thereof is from upper left to lower right; with regard to the bit line contact areas between fifth and seventh word lines, the direction of the memory cell pair having the bit line contact area at the center thereof is from lower left to upper right; and so on. Examples of the top view of the device of FIG. 21 are shown in FIGS. 22, 23, and 24. The cross-sectional view of the device of FIG. 21 is substantially the same as FIG. 10. To assist understanding, in FIGS. 22, 23, and 24, hatchings are applied to the configuration of storage capacitor electrode 24.

Based on the above described devices shown in FIG. 8 and FIG. 21, the analysis of the increase of degree of integration caused by the reduction of pitch of the sense amplifiers, and the general rule for determining the pattern of the device having the minimum sense amplifier pitch are described as follows with reference to FIGS. 25A, 25B, 26, 27A, and 27B.

First, the increase of degree of integration caused by the reduction of pitch of the sense amplifiers is described with reference to FIGS. 25A, 25S, and 26. FIGS. 25A and 25S correspond to the prior art device, and FIG. 26 corresponds to the devices of FIG. 8 and FIG. 21, L is the width of the bit line BL, S is the gap between the adjacent bit lines, H is the diameter of the contact hole (i.e., the diameter of the contact area) for the bit line contact area or the storage capacitor contact area, $M_1$ is the inner allowance of the contact hole, and $M_0$ is the outer allowance of the contact hole.

The pitches P (FIG. 25A) and P (FIG. 25S) of the sense amplifiers in the cases of FIG. 25A and 25a are calculated as follows, $$P \text{ (FIG. 25A)} = \frac{1}{2}H + M_i + S + L + S + M_i + \frac{1}{2}H$$

$$P \text{ (FIG. 25B)} = \frac{1}{2}L + M_0 + H + M_0 + L + M_0 + H + M_0 + \frac{1}{2}L$$

If it is assumed that L, S, and H are equally the same as F, and that $M_i$ and $M_0$ are equally the same as M, the calculation is as follows, $$P \text{ (FIG. 25A)} = 4F + 2M$$

$$P \text{ (FIG. 25B)} = 4F + 4M$$

From this calculation, it is acknowledged that the pitch in the case of FIG. 25B is greater by 2M than the pitch in the case of FIG. 25A. Thus, the pattern must be determined not by FIG. 25A but by FIG. 25B, and accordingly the unused wasteful space is caused.

In the case of FIG. 26, the pitch P (FIG. 26) of the sense amplifiers is calculated as follows.

$$P(\text{FIG. 26}) = \frac{1}{2}L + M_0 + H + M_0 + L + S + M_i + \frac{1}{2}H$$
$$= 4F + 3M$$

Thus, the pitch in the case of FIG. 26 is less by 1M than the pitch in the case of FIGS. 25A and 25B. This constitutes the main reason for the increase in degree of integration in the devices FIG. 8 and FIG. 21.

Second, the general rule for determining the pattern of the device having the minimum sense amplifier pitch is described with reference to FIGS. 27A and 27B. FIG. 27A shows an arrangement according to the general rule, and FIG. 27B shows an imaginary arrangement which is impossible to realize.

In the devices of FIGS. 8 and 21, since two storage capacitor contact areas are provided for each bit line contact area, the ratio between the number of the bit line contact areas $C_b$ and the number of the storage capacitor contact areas $C_s$ in the entire memory cell array is as follows.

$$N(C_b):N(C_s)=1:2$$

If there are excessive numbers of bit line contact areas between a first space between two adjacent word lines to give the relationship $2N(C_b)>N(C_s)$, in the second space between two adjacent word lines next to the first space, the number of storage capacitor contact areas must be excessive to give the relationship $2N(C_b)<N(C_s)$ to maintain the above-mentioned ratio. If the number of the storage capacitor contact areas becomes excessive, the pitch of the sense amplifiers for such storage capacitor contact areas becomes maximum, and the size of the memory cell array is determined by such maximum pitch of the sense amplifiers so that a reduction in size is prevented.

Thus, it is concluded that the pitch of the sense amplifiers becomes minimum in the case where the ratio of $N(C_b)$ and $N(C_s)$ is 1:2" in each of the spaces between two adjacent word lines.

The analysis of the repetitive basic unit of the pattern of the arrangement of the bit line contact areas and the storage capacitor contact areas is described as follows. In the minimum basic unit of the pattern of the arrangement of the bit line contact areas and the storage capacitor contact areas which is defined by the pitch of the word lines and the pitch of the sense amplifiers (which is twice the pitch of the bit lines), there is on average one storage capacitor contact area.

Also, the ratio between the number of the bit line contact areas and the number of the storage capacitor contact areas is required to be 1:2. Thus, the pitch of the sense amplifiers becomes minimum when the average number of the bit line contact areas is ½ and the number of the storage capacitor contact areas is 1 in each of the minimum basic units.

Both the number of the bit line contact areas and the number of the storage capacitor contact areas in the repetitive basic unit should be integers. Hence, the number of the repetitive basic units must be 2n times the number of the minimum basic unit, where n is an integer.

Accordingly, a unit defined by one pitch of the word lines WL and the 2n times the pitch of the sense amplifiers $A_s$ is the repetitive basic unit.

The general rule of the pattern of the device for attaining the minimum pitch of the sense amplifiers is described with reference to FIGS. 27A and 27B as follows. Since the pattern of the repetitive basic unit is of the translational symmetry, the pattern of the repetitive basic unit according to the general rule is as shown in FIG. 27A.

After the patterns of the bit line contact areas $C_b$ and the storage capacitor contact area $C_s$ are determined, the location of a bit line contact area on a bit line is determined, and thus the entire arrangement of the device is determined. There are rules for determining the location of the bit line contact area such that: between two adjacent word lines, bit line contact areas should not be located on the same bit line; in the spaces between the sequence of the word line WL, the sequence in the manner that $C_b$ on BL (a), $C_b$ on BL (b), and $C_b$ on EL (a) as imaginarily shown in FIG. 27B is impossible to realize; and the like.

In consequence, in the design of the arrangement of the device, after the repetitive basic unit is determined, the locations of the bit line contact areas are determined according to the above-described rules, and after that the locations of the storage capacitor contact areas are determined.

Figure 28:
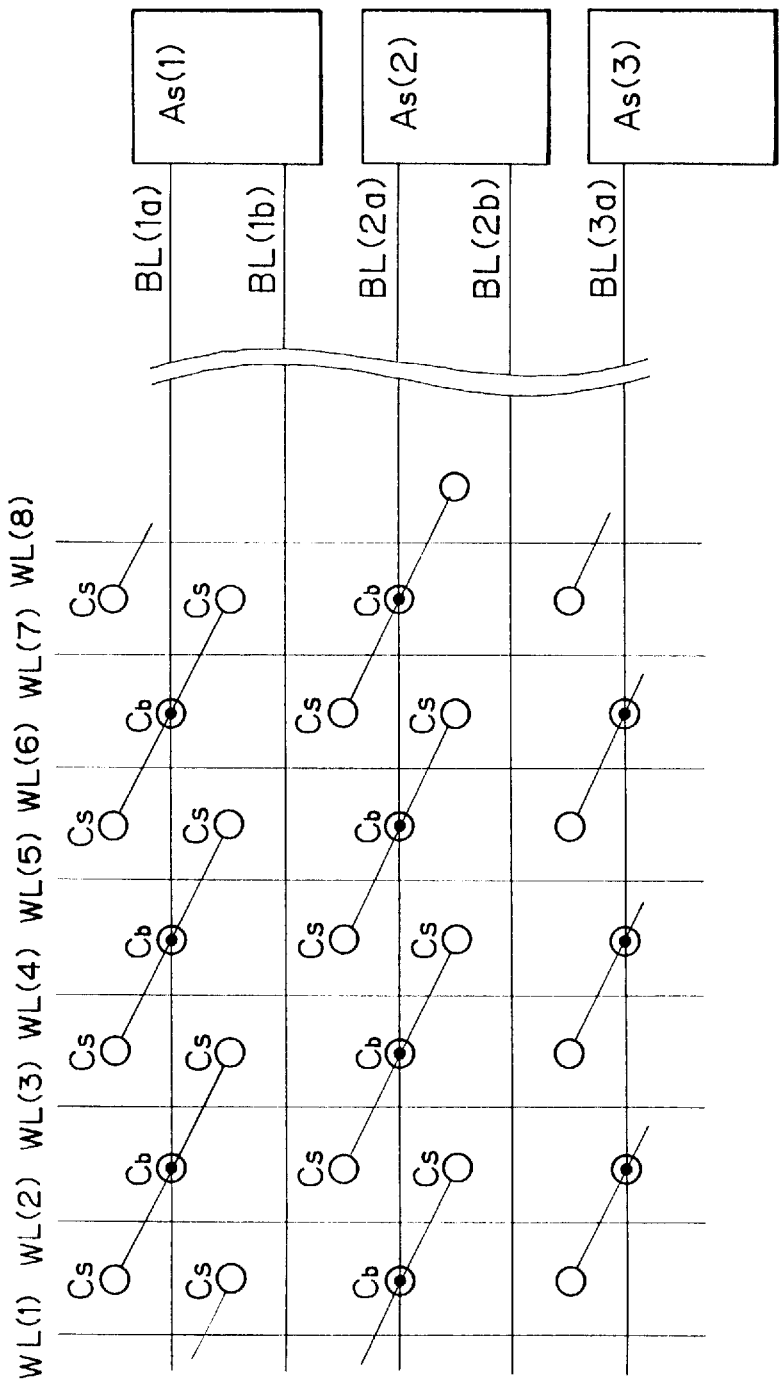
FIGS. 28 to 32 show a storage capacitance type dynamic RAM according to other embodiments of the present invention.
Figure 29:
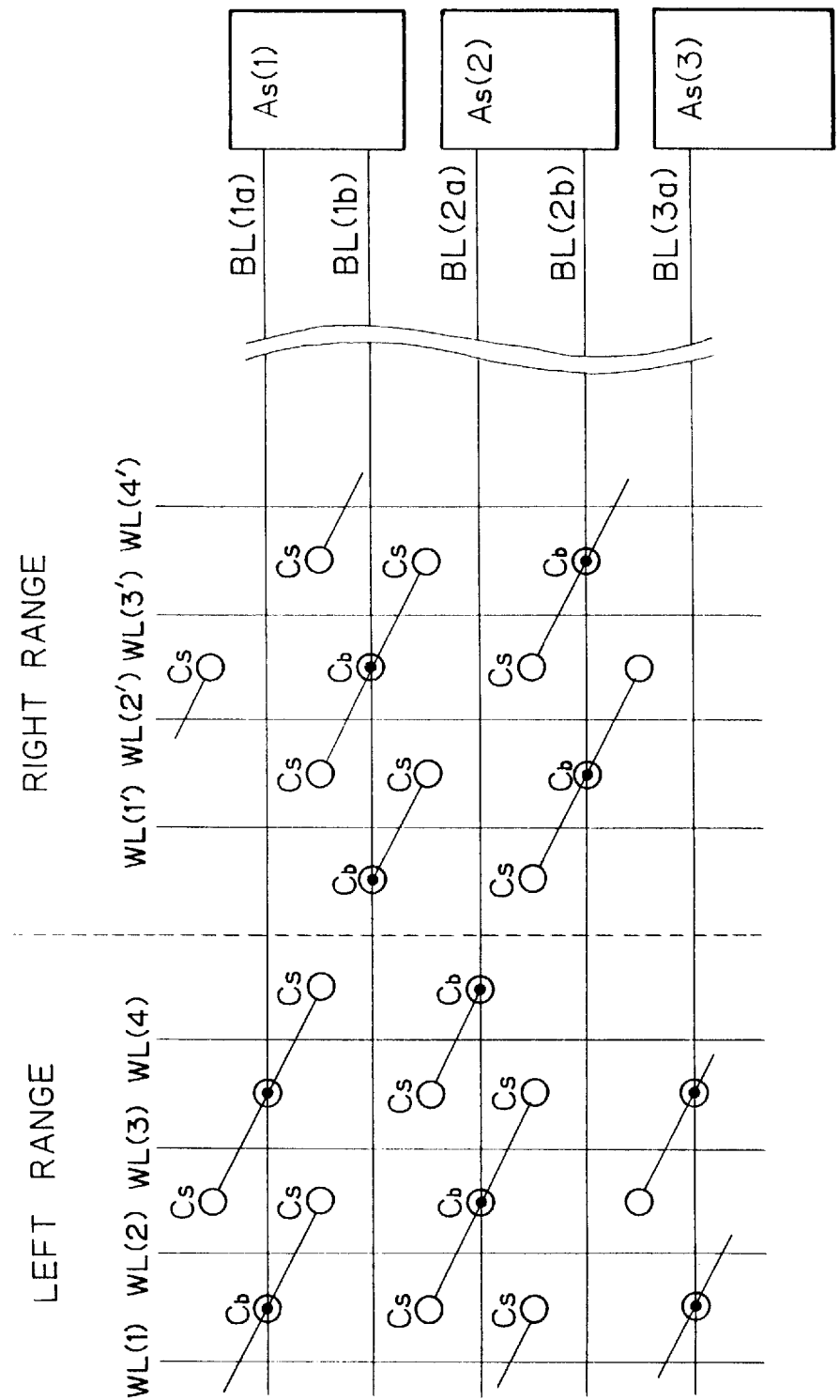
Figure 30:
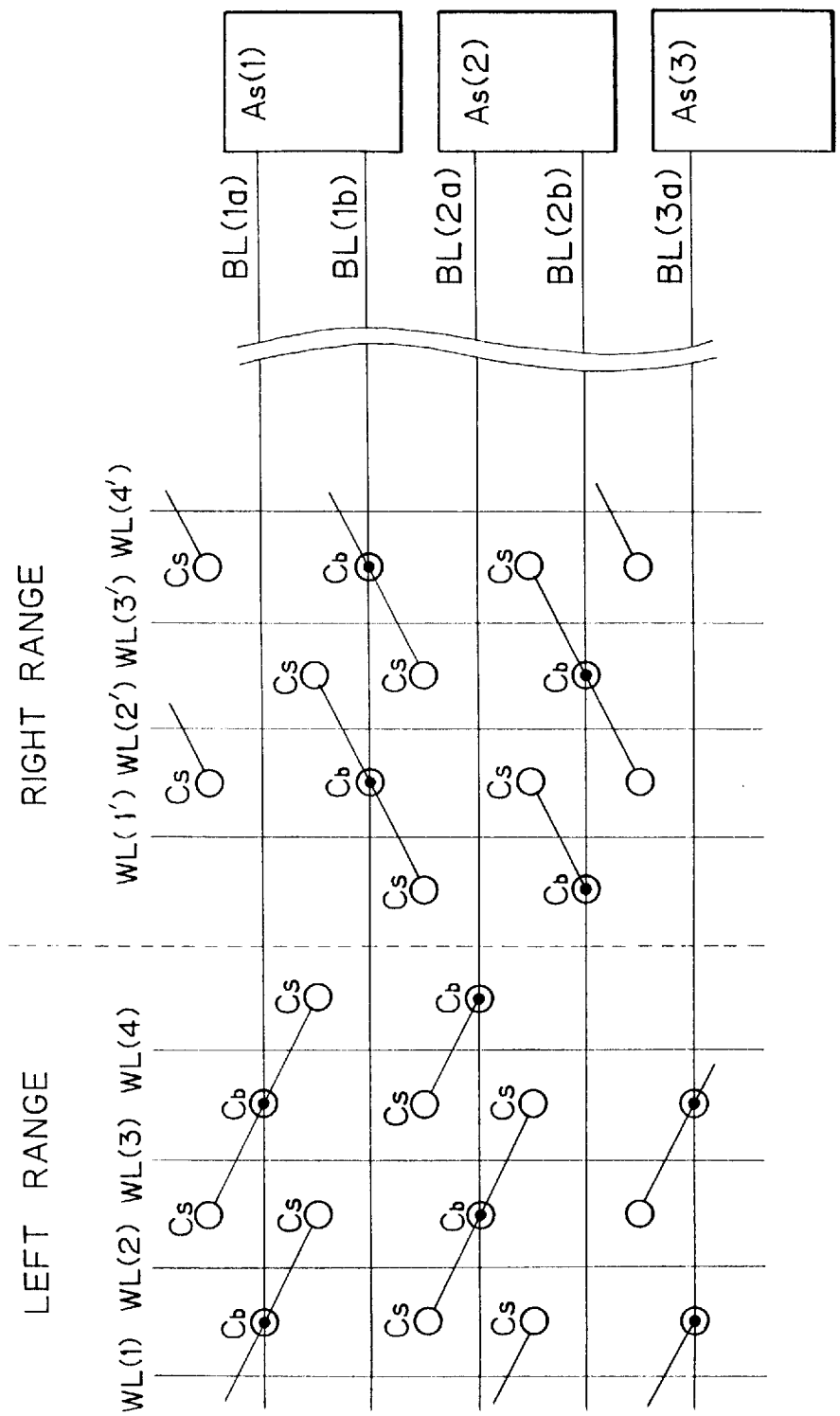

Storage capacitance type dynamic RAMs according to other embodiments of the present invention are shown in FIGS. 28, 29, and 30. In the devices shown in FIGS. 28, 29, and 30, the bit line contact areas $C_b$ are located only on one bit line of a bit line pair.

In the device shown in FIG. 28, the direction of arrangement of each of the memory cell pairs is from upper left to lower right.

In the devices shown FIGS. 29 and 30, the position of the bit line on which the bit line contact areas are located is switched in the right range having the word lines W (1'), W (2'), W (3') . . . , from the left range having the word lines w (1), W (2), W (3), . . . . This switching of the bit lines is desirable for cancelling the imbalance n the capacitance of the bit line.

In the device shown in FIG. 29, the direction of arrangement of each of the memory cell pairs in both of the left and right ranges is from upper left to lower right. In the bit line switching portion between the left and right ranges, one word line between the word lines WL (4) and WL (1') is removed to form twice the word line pitch between the word lines WL (4) and WL (1'). There are memory cell pairs having one bit line contact area and one storage capacitor contact area in the bit line switching portion.

In the device shown in FIG. 30, in the left range the direction of each of the memory cell pairs is from upper left to lower right, while in the right range the direction of each of the memory cell pairs is from lower left to upper right.

Figure 31:
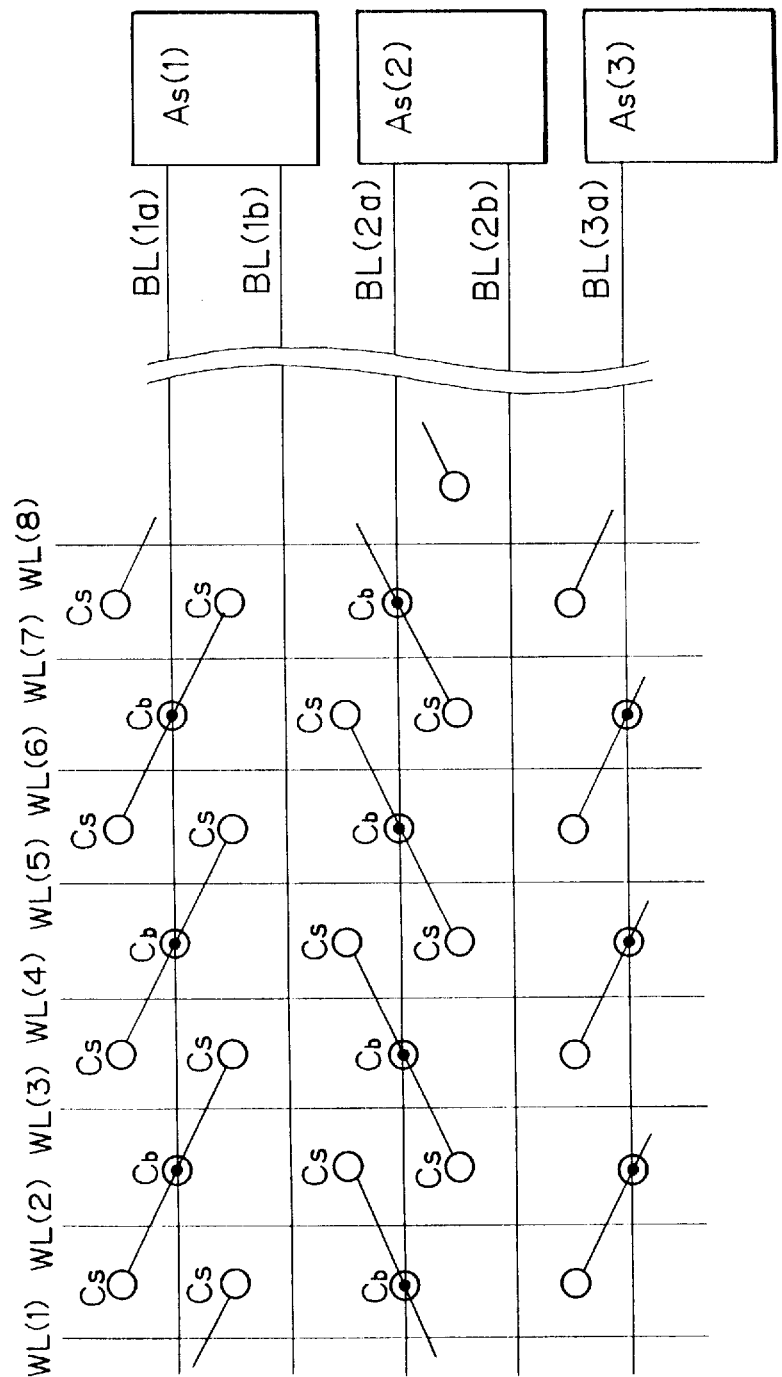
Figure 32:
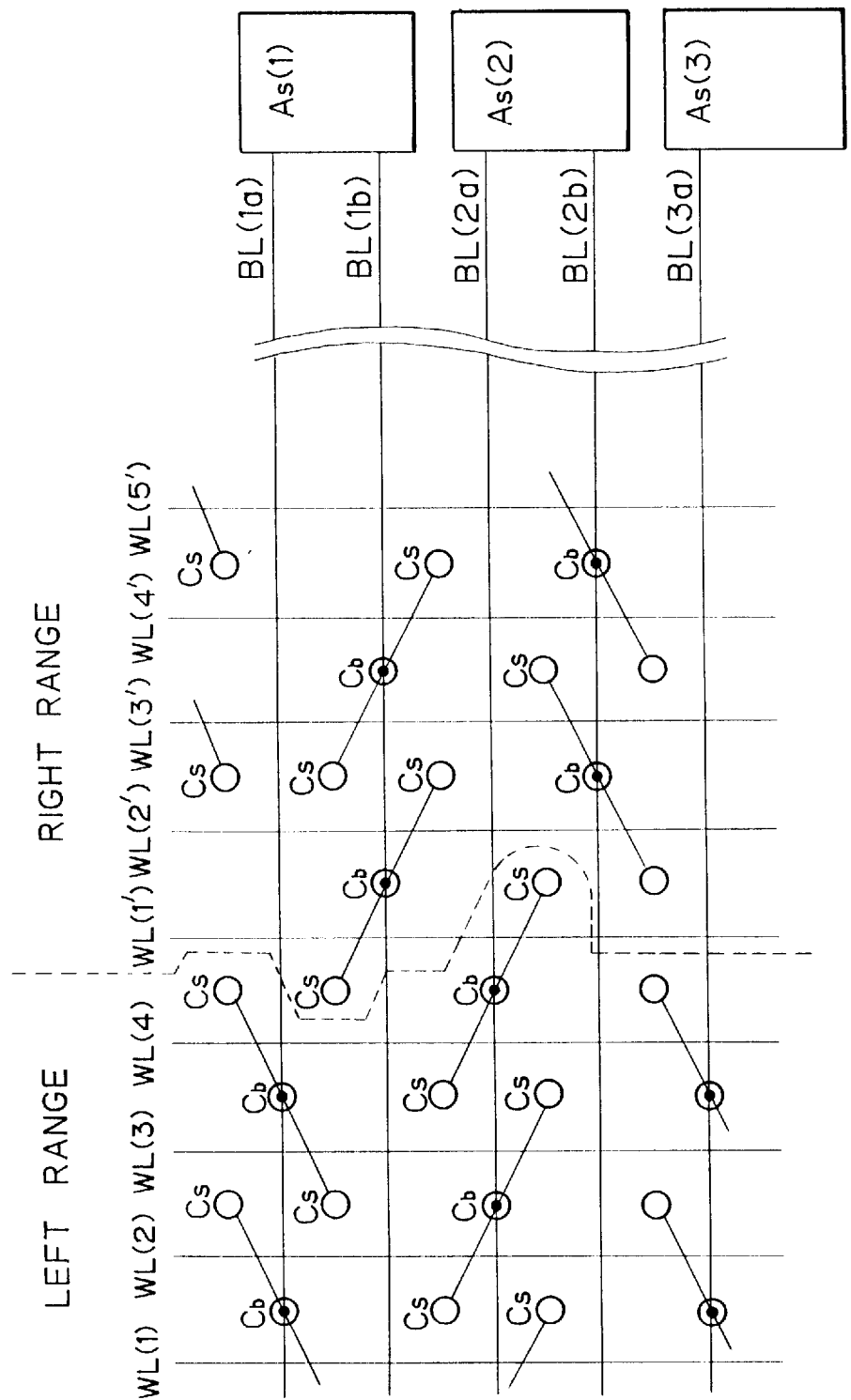
Figure 33:
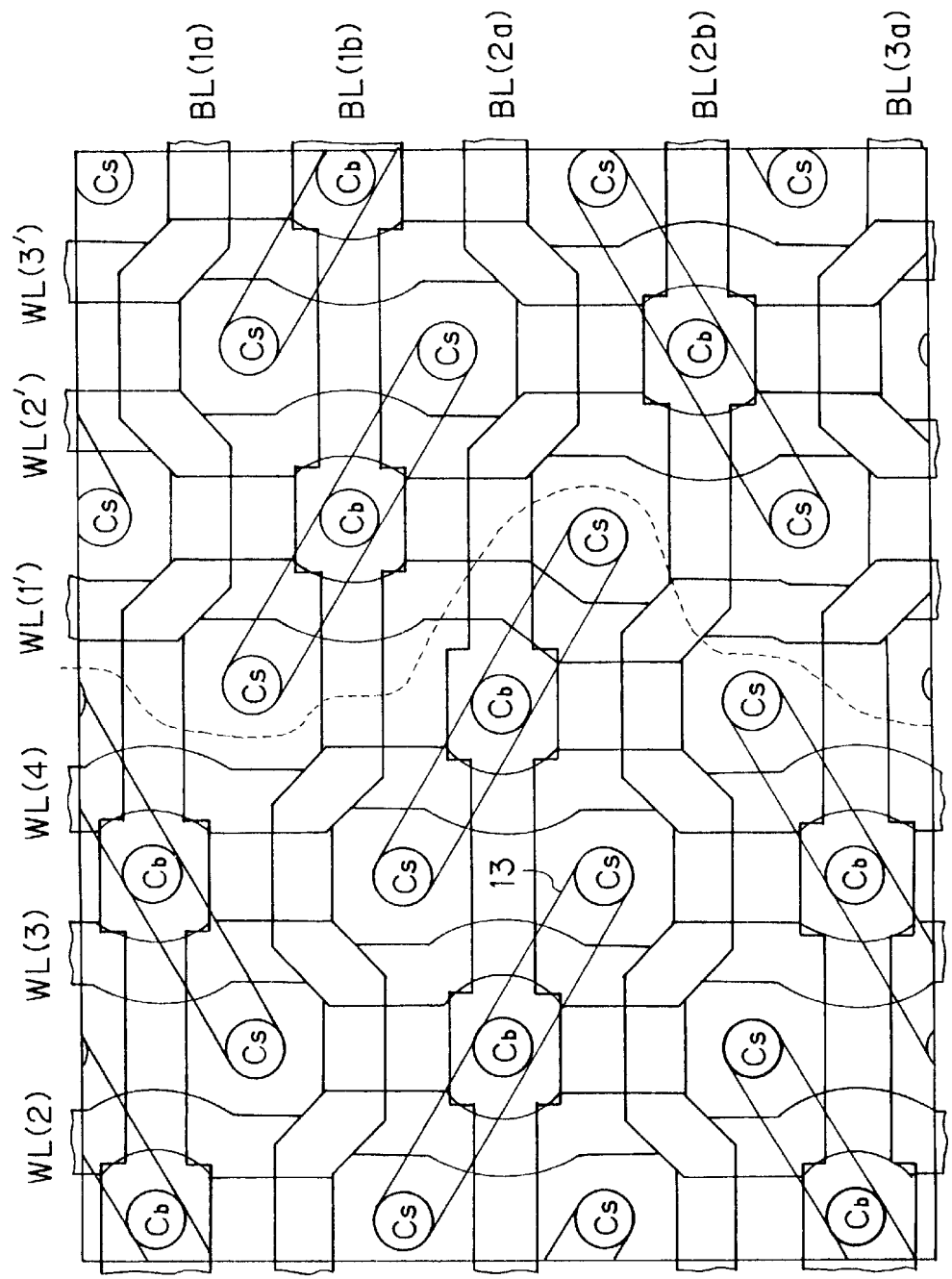
FIG. 33 shows the pattern of the memory device of FIG. 32.

Storage capacitance type dynamic RAMs according to other embodiments of the present invention are shown in FIGS. 31, 32, and 33. The top view of the bit line switching portion of the device of FIG. 32 is shown in FIG. 33.

In the device shown in FIG. 31, the direction of each of the memory cell pairs having the bit line contact areas located on the bit line BL (1a) is from upper left to lower right, and the direction of each of the memory cell pairs having the bit line contact areas located on the bit line BL (2a) is from lower left to upper right.

In the device shown in FIG. 32, the bit line on which the bit line contact areas are located is switched from the left range to the right range. In the device shown in FIG. 32, the occurrence of the unused wasteful spaces in the bit line switching portion is avoided.

Figure 34:
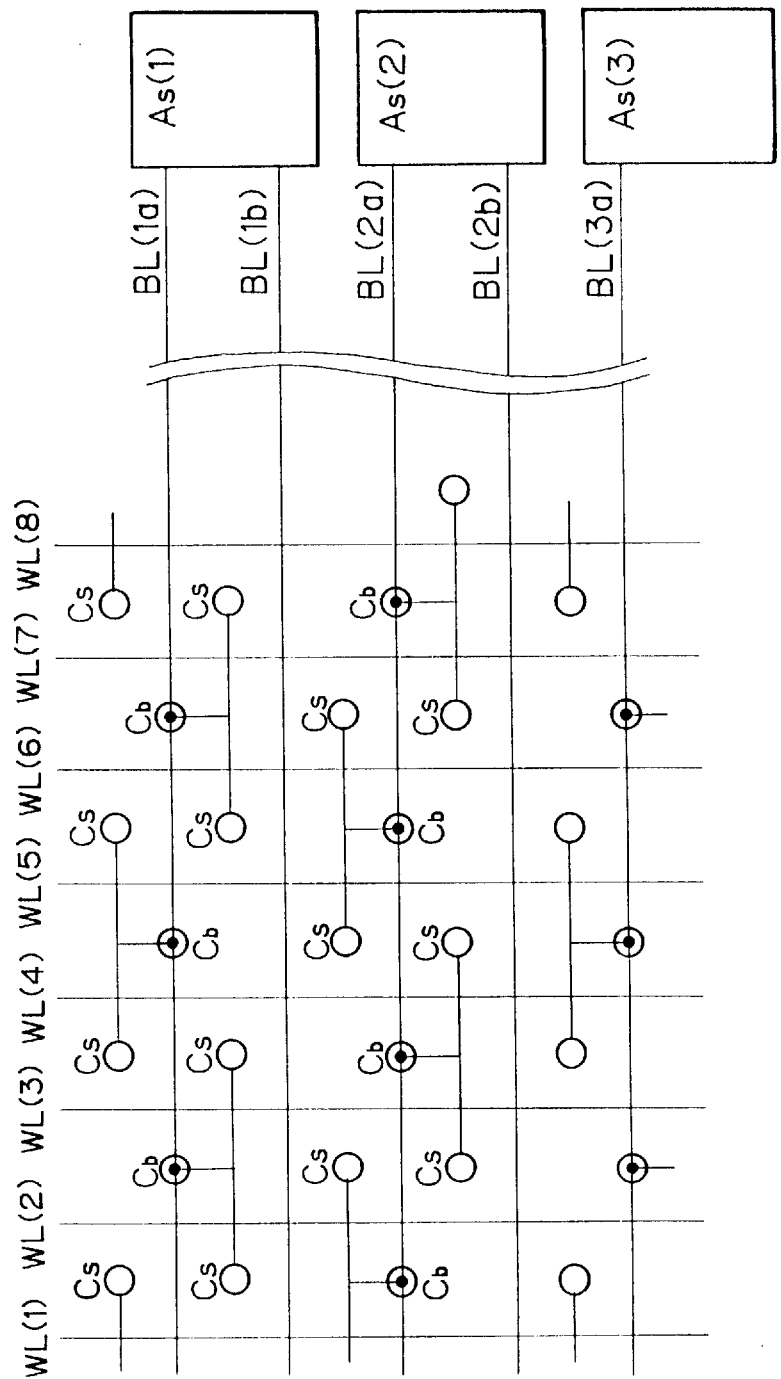
FIG. 34 shows a storage capacitance type dynamic RAM according to another embodiment of the present invention.
Figure 35:
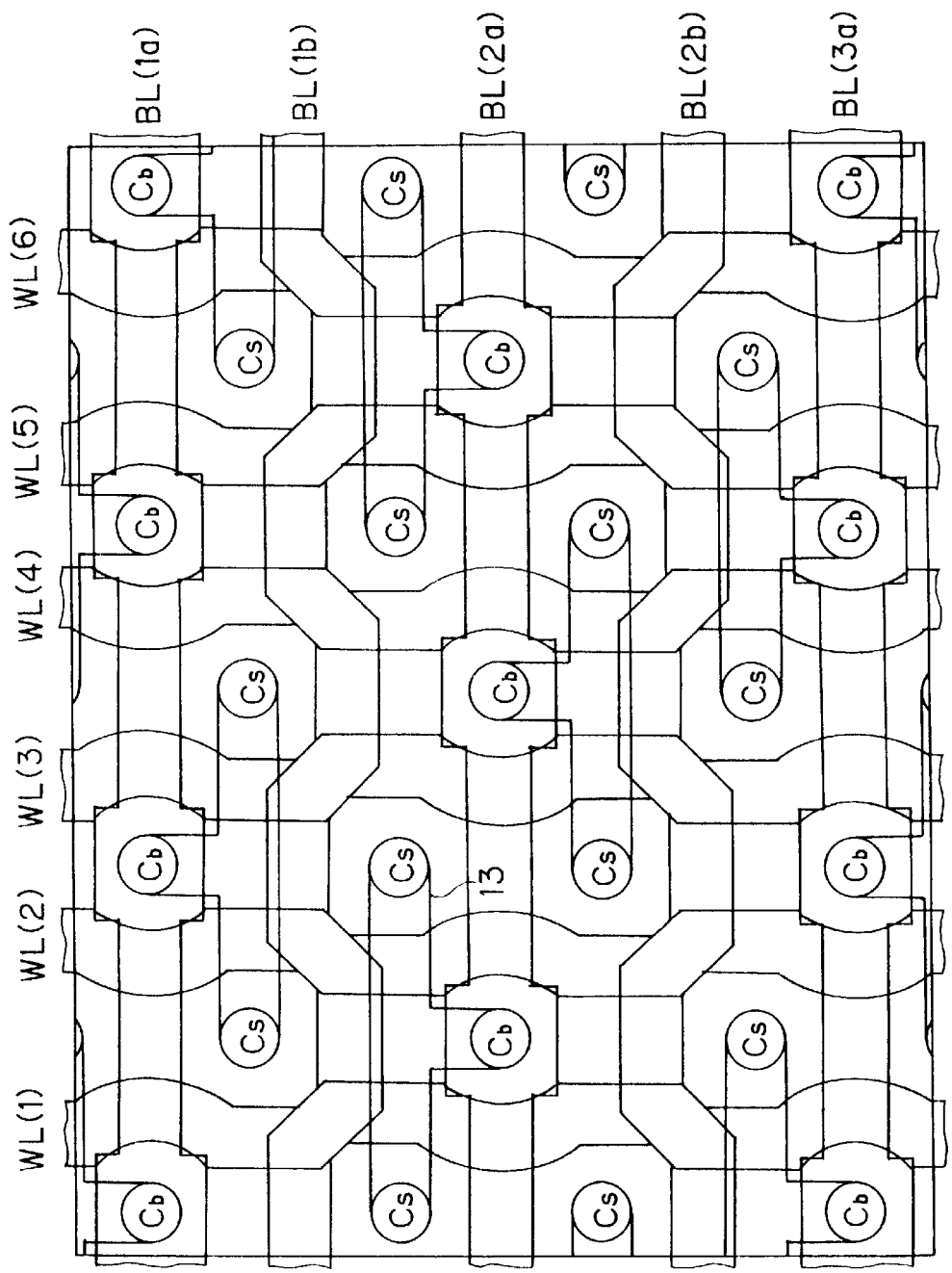
FIG. 35 shows the pattern of the memory device of FIG. 34.
Figure 36:
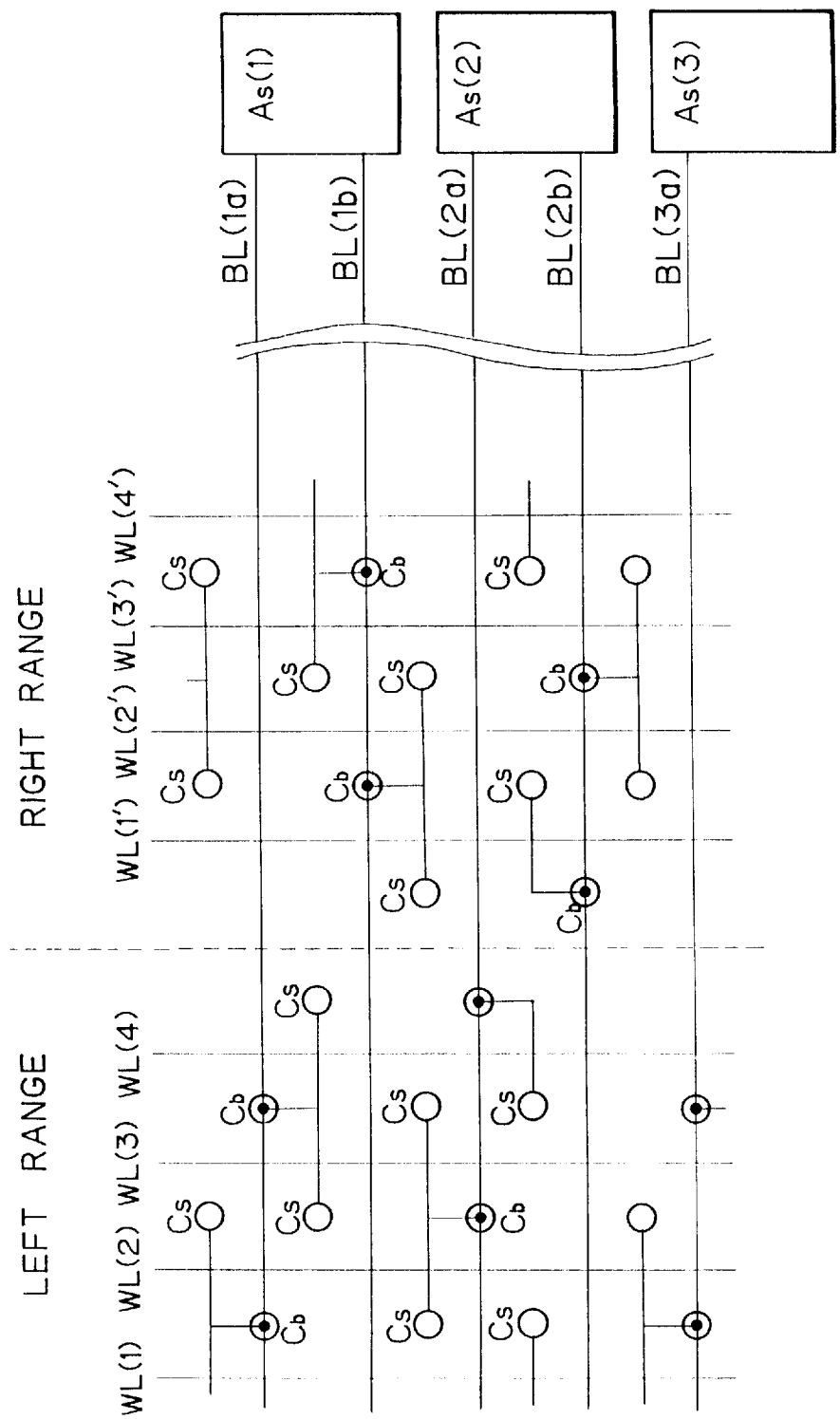
FIGS. 36 and 37 show a storage capacitance type dynamic RAM according to another embodiment of the present invention.

Storage capacitance type dynamic RAMs according to other embodiments of the present invention are shown in FIGS. 34 and 36. In the devices of FIGS. 34 and 36, each of the active regions is of a T shape which is parallel with both the bit lines and word lines, and the transfer transistor in the active region is perpendicular to the word line. With regard to one bit line on which the bit line contact areas are located, the T shapes are arranged to have the true and the inverted directions alternately. The top view of the device of FIG. 34 is shown in FIG. 35. In the device of FIG. 36, the bit line on which the bit line contact areas are located is switched from the left range to the right range.

Figure 37:
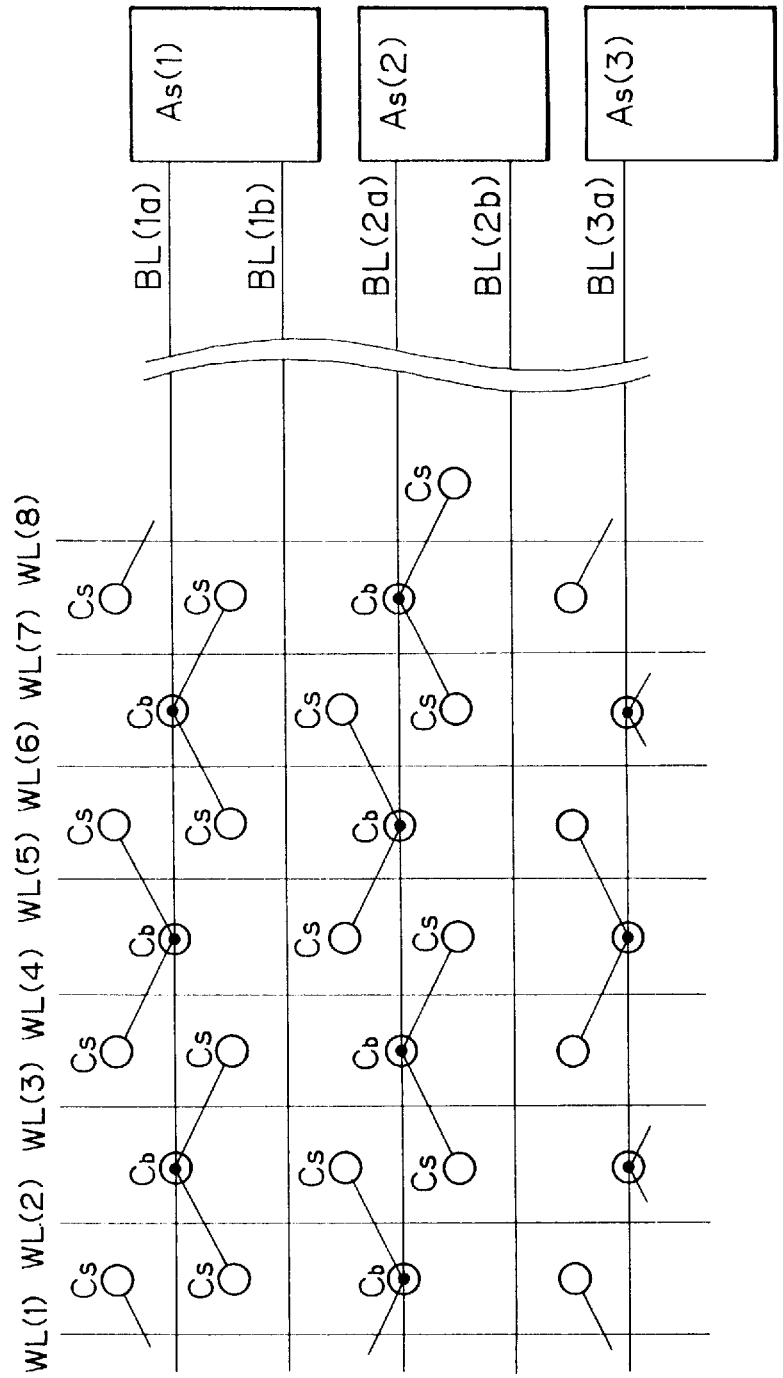
Figure 38:
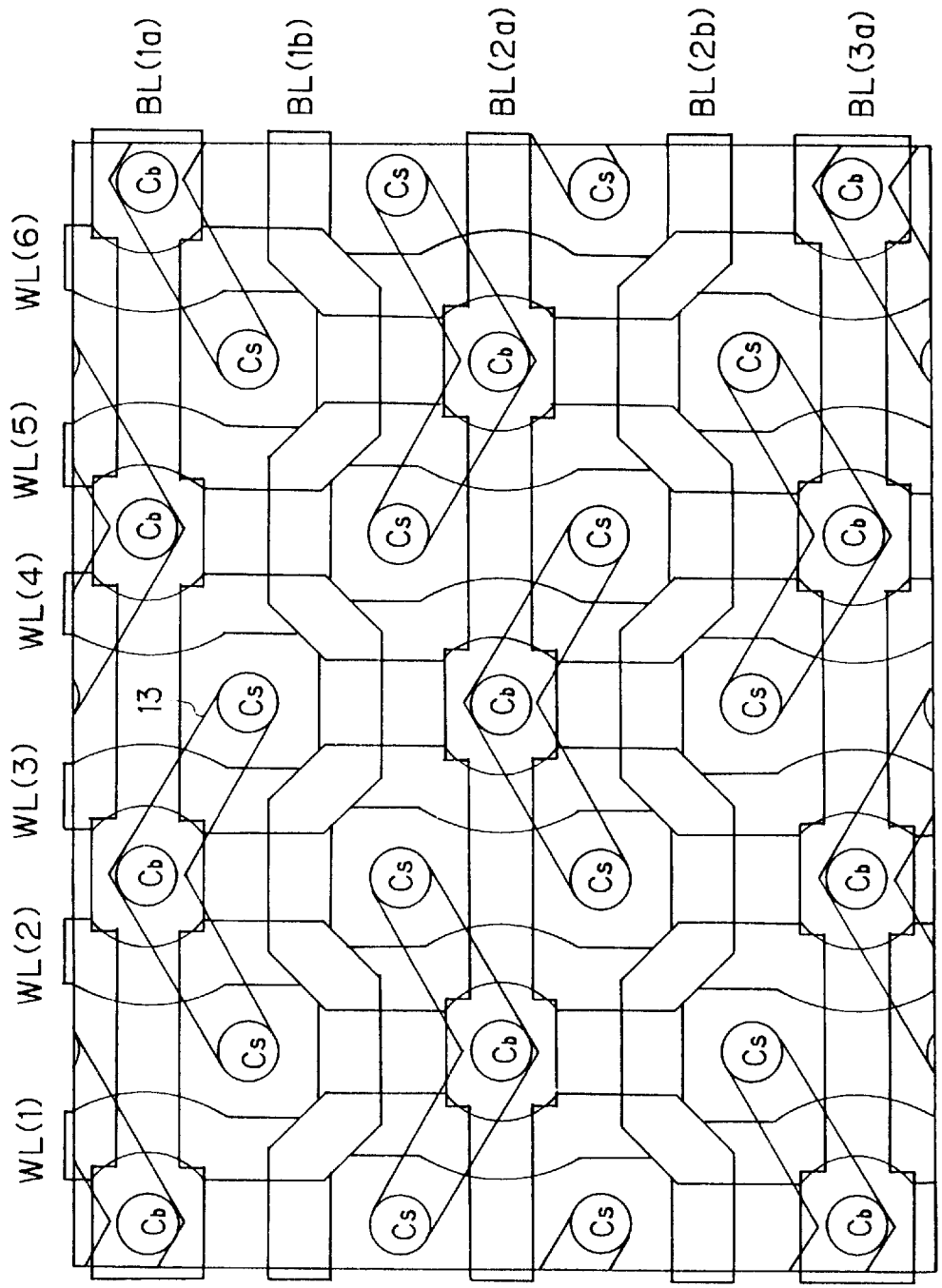
FIG. 38 shows the pattern of the memory device of FIG. 37.
Figure 39:
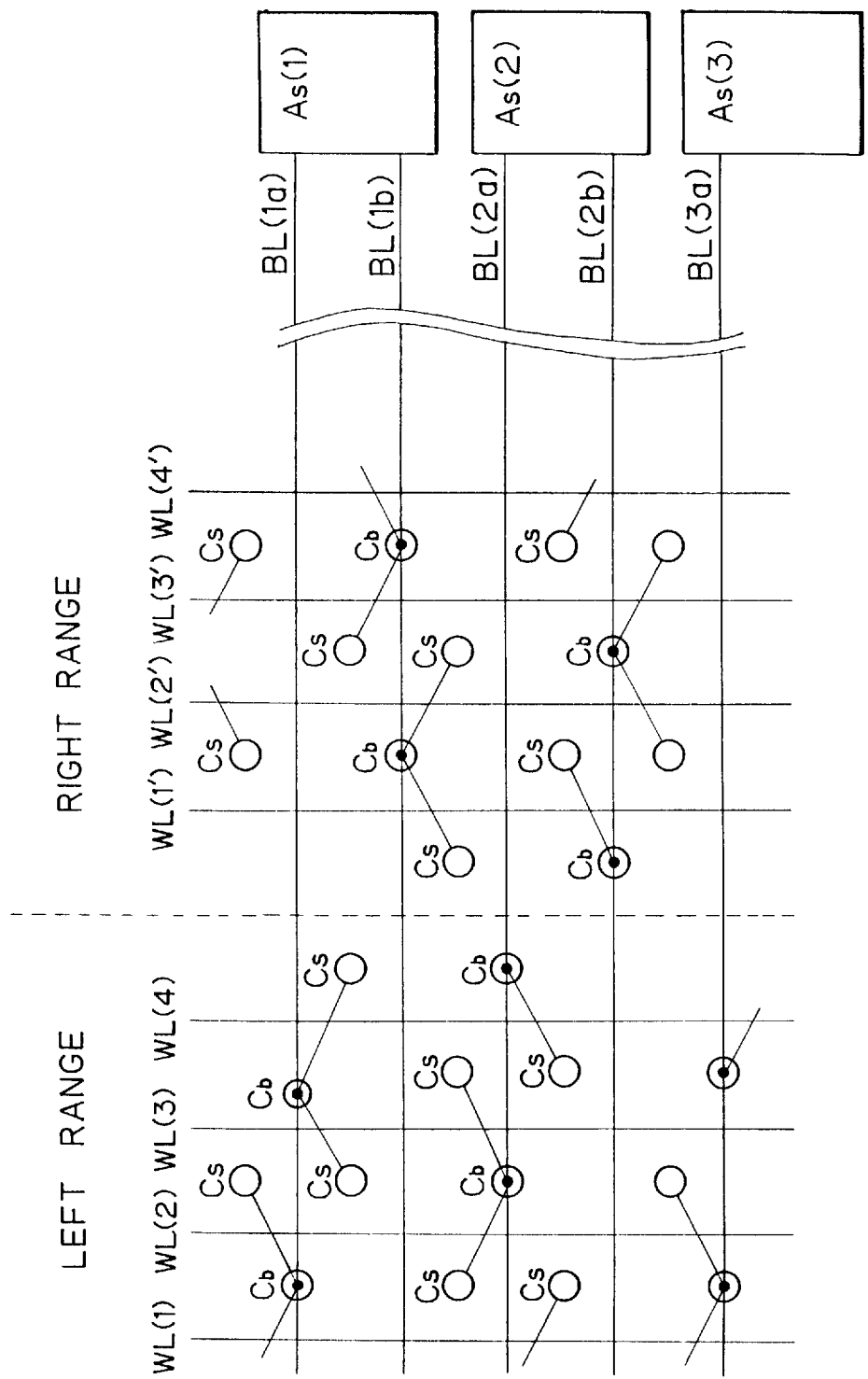
FIGS. 39 and 40 show a storage capacitance dynamic RAM according to other embodiments of the present invention.

Storage capacitance type dynamic RAMs according to other embodiments of the present invention are shown in FIGS. 37 and 39. In the devices of FIGS. 37 and 39, each of the active regions is of a V shape. With regard to one bit line on which the bit line contact areas are located, the V shapes are arranged to have the true and the inverted directions alternately. The top view of the device of FIG. 37 is shown in FIG. 38. In the device of FIG. 39, the bit line on which the bit line contact areas are located is switched from the left range to the right range.

Figure 40:
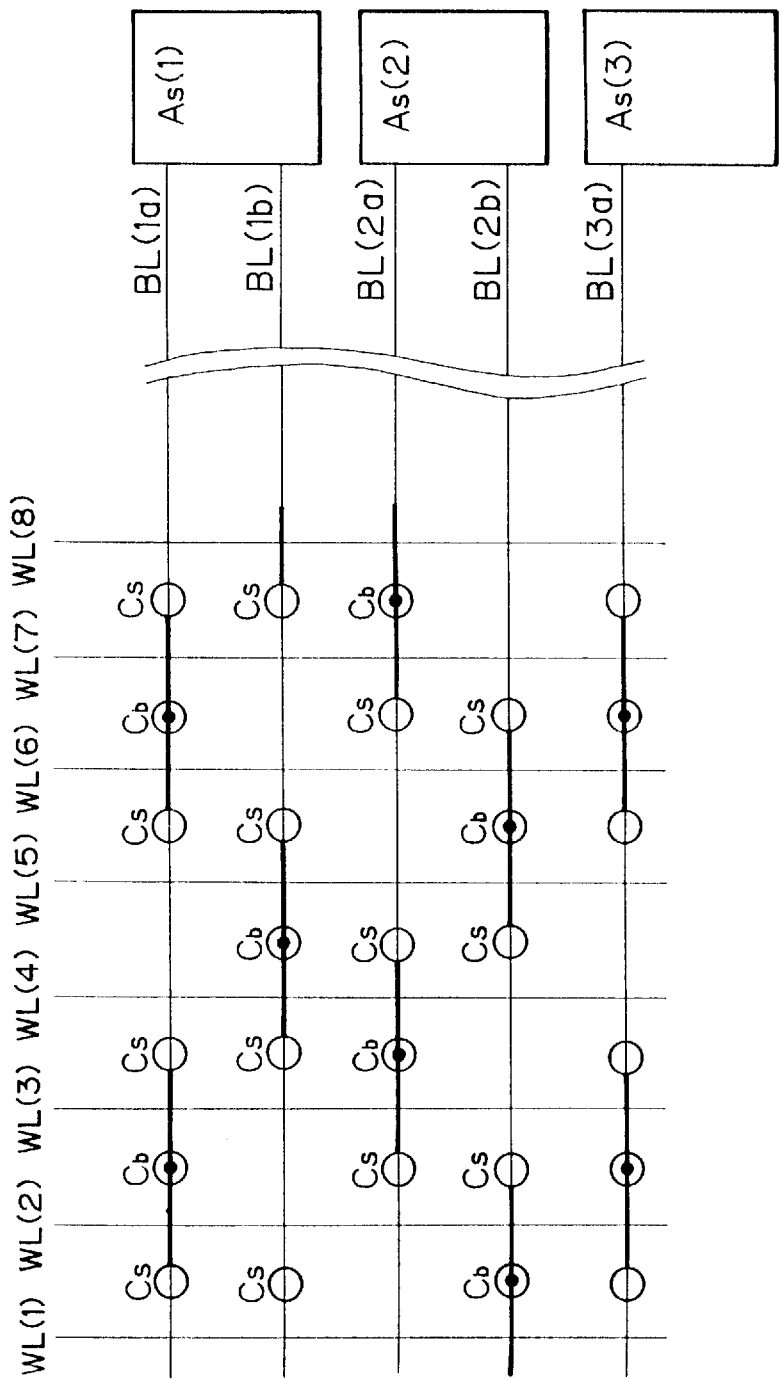
Figure 41:
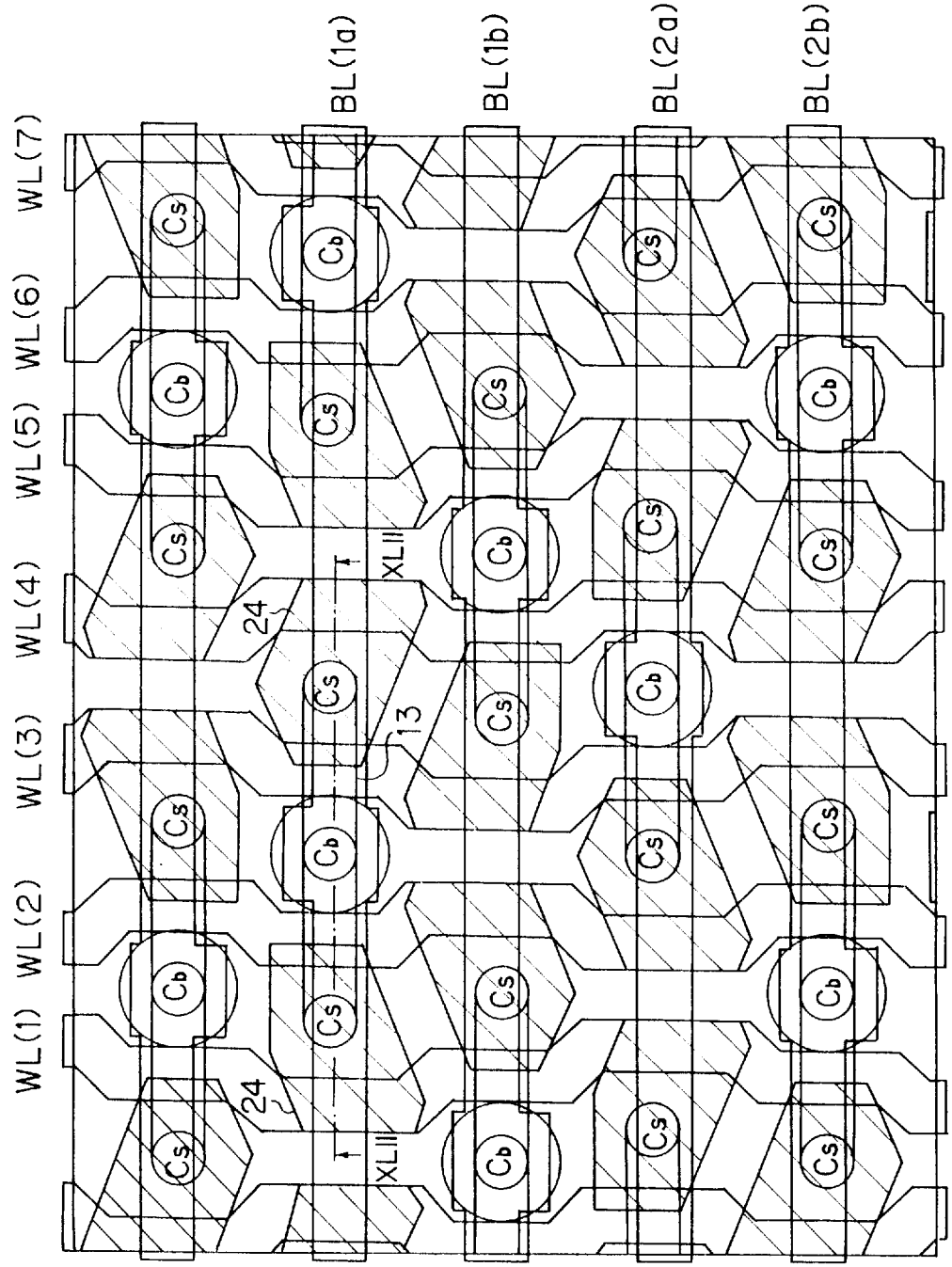
FIG. 41 shows the pattern of the memory device of FIG. 40.
Figure 42:
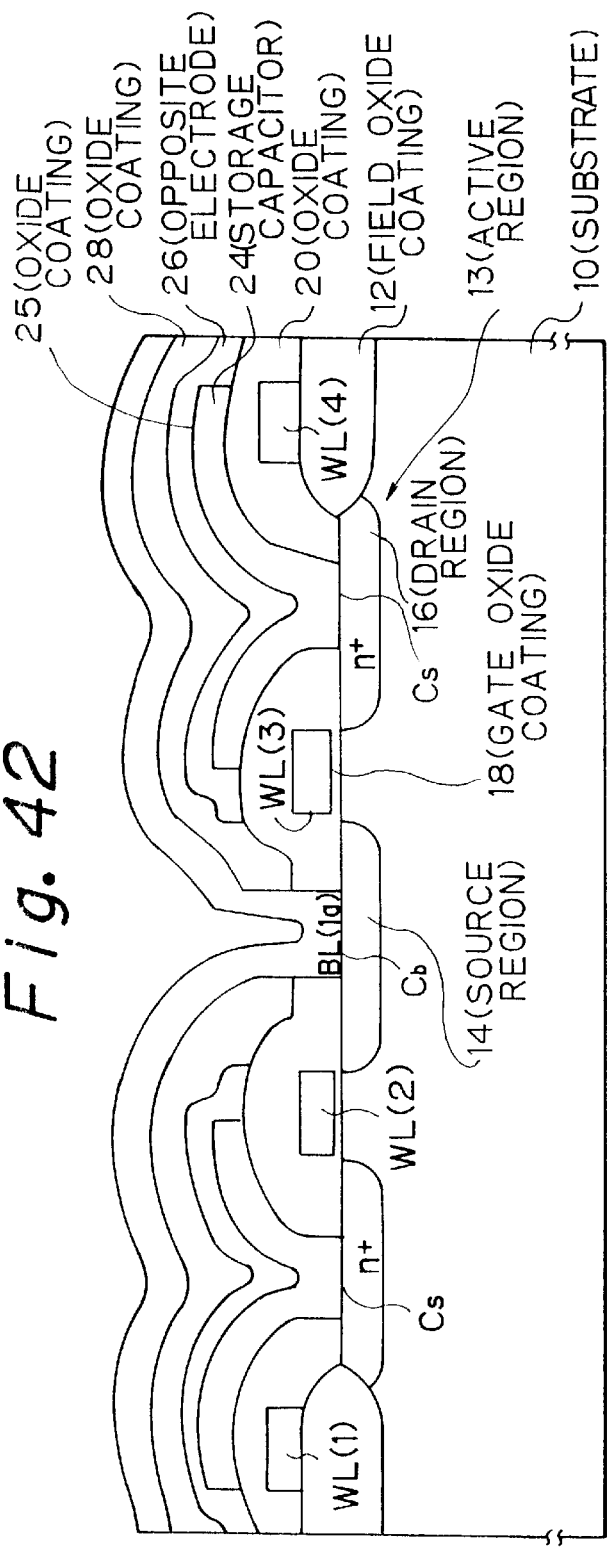
FIG. 42 is a cross-sectional view along line XLII—XLII of the memory device of FIG. 41; is

A storage capacitance type dynamic RAM according to another embodiment of the present invention is shown in FIG. 40. In the device of FIG. 40, each of the storage capacitor contact areas $C_s$ is located beneath a bit line. Each of the storage capacitor contact areas $C_s$ overlaps a bit line, as in the case of the bit line contact area. The top view of the device of FIG. 40 is shown in FIG. 41. To assist understanding, hatchings are applied to the configurations of the storage capacitor electrodes 24. The cross-sectional view along line XLII—XLII of FIG. 41 is shown in FIG. 42. The basic pattern of the memory cell array in the device of FIG. 40 is illustrated in FIG. 43.

Figure 43:
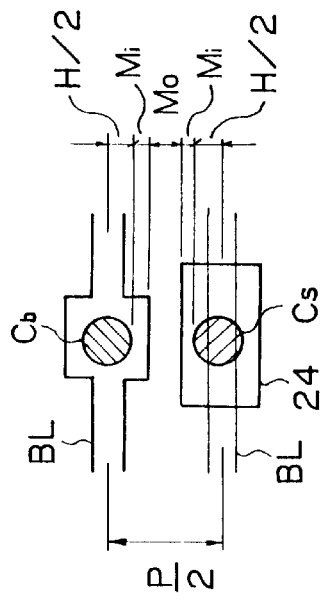
FIG. 43 illustrates the dimensions of the bit line contact area, the storage capacitor contact area, and the bit line in the memory device of FIG. 40.

The analysis of the pattern shown in FIG. 43 can be given similarly to the case of FIG. 26. One half of the pitch of the sense amplifiers is calculated as follows.

$$P \text{ (FIG. 43)} \times \tfrac{1}{2} = \tfrac{1}{2}H + M_i + M_0 + M_i + \tfrac{1}{2}H$$

Accordingly, the pitch of the sense amplifier is calculated as follows.

$$\begin{aligned} P(\text{FIG. 43}) &= 2(F + 3M) \\ &= 2F + 6M \end{aligned}$$

Since usually M is equal to half of F, the pitch is given as follows.

$$P \text{ (FIG. 43)} = 5F$$

In the prior art, the pitch of the sense amplifiers is P (prior art)$\times \tfrac{1}{2} = \tfrac{1}{2}H + M_i + S + M_i + \tfrac{1}{2}H$. Hence, the pitch in the prior art is P (prior art)=6F.

Accordingly, the pitch of the sense amplifiers shown in FIG. 43 is less by 1F than the pitch in the prior art to enable an increase in the degree of integration.

Figure 44:
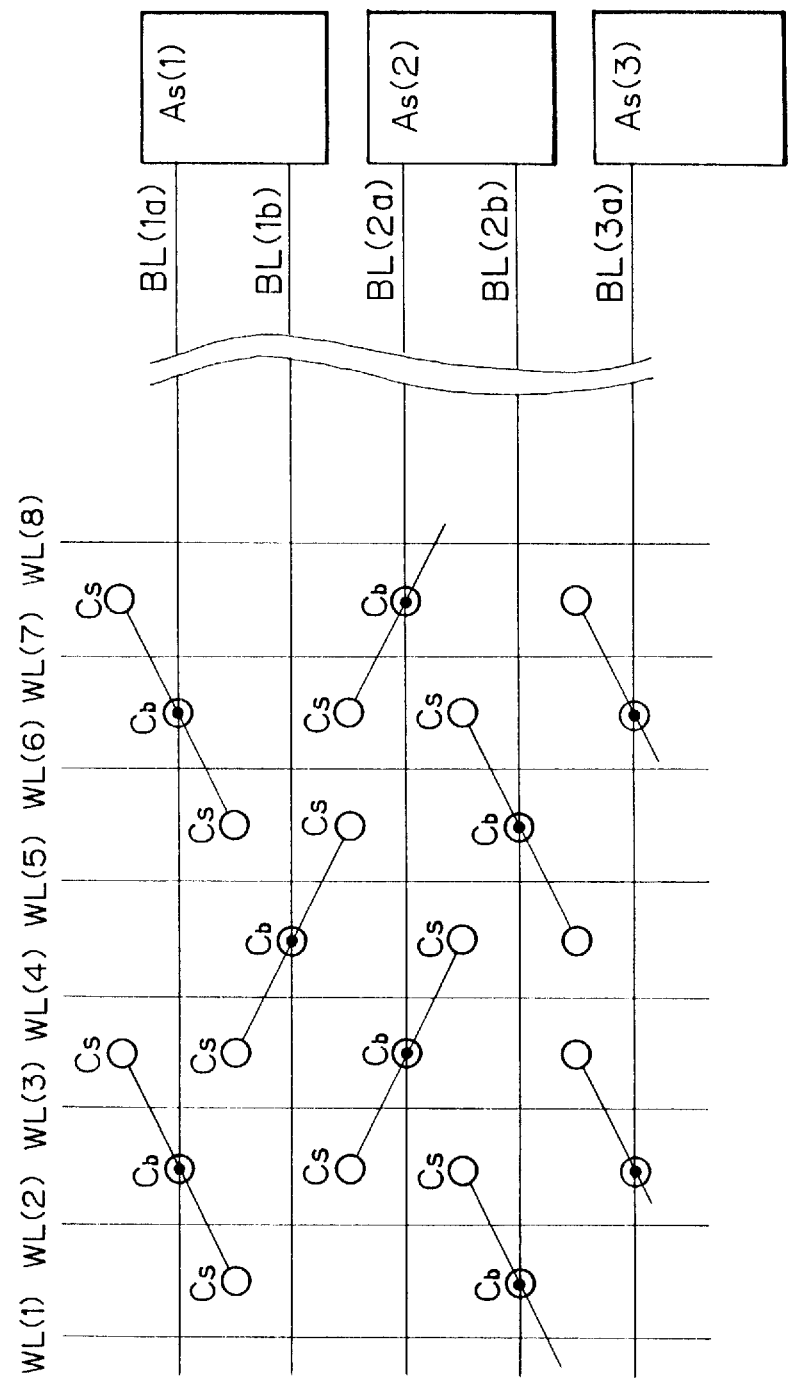
FIG. 44 shows a storage capacitance type dynamic RAM according to a further embodiment of the present invention.

A storage capacitance type dynamic RAM according to a further embodiment of the present invention is shown in FIG. 44. The top view of the device of FIG. 44 is shown in FIG. 45. In the device of FIG. 44, each of the storage capacitor contact areas is located beneath a bit line.

We claim:

1. A semiconductor memory device comprising:

a plurality of word lines and a plurality of bit lines intersected by said plurality of word lines; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact to the storage electrode of the capacitor;

a memory cell pair being formed by two nearby memory cells and these two memory cells of the memory cell pair having a common bit line contact;

wherein, in a portion where a storage electrode extending from a storage capacitor contact overlaps a word line and a bit line, in the cross-sectional structure of the device, the storage electrode extending from the storage capacitor contact is located above the word line and the bit line and wherein the bit line includes a bent portion where the bit line is separated from the storage capacitor contact by a predetermined distance; and wherein, in any given unit region defined by two adjacent word lines and five consecutively adjacent bit lines, there are twice as many storage capacitor contacts as there are bit line contacts.

2. A semiconductor memory device comprising:

a plurality of word lines and a plurality of bit lines intersected by said plurality of word lines; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact area to the storage electrode of the capacitor;

a memory cell pair being formed by two nearby memory cells and these two memory cells of the memory cell having a common bit line contact;

wherein, in the portion where a storage electrode extending from a storage capacitor contact overlaps a word line and a bit line, in the cross-sectional structure of the device, the storage electrode extending from the storage capacitor contact is located above the word line and the bit line and wherein the bit line includes a bent portion where the bit line is separated from the storage capacitor contact by a predetermined distance; and wherein bit line contacts of the memory cell pairs connected to the adjacent bit lines are located on the opposite sides of a word line, and the lines, along each of which the storage capacitor contacts and the transfer transistors of a memory cell pair are arranged, are arranged in parallel.

3. A semiconductor memory device comprising:

a plurality of word lines and a plurality of bit lines intersected by said plurality of word lines; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact to the storage electrode of the capacitor;

a memory cell pair being formed by two nearby memory cells and these two memory cells of the memory cell having a common bit line contact;

wherein, in the portion where a storage electrode extending from a storage capacitor contact overlaps a word line and a bit line, in the cross-sectional structure of the device, the storage electrode extending from the storage capacitor contact is located above the word line and the bit line; and wherein bit line contacts of the memory cell pairs which are connected to the adjacent bit lines are located on the opposite sides of a word line, and the lines, along each of which the storage capacitor contacts and the transfer transistors of a memory cell are arranged, are arranged obliquely with regard to directions of the bit lines.

4. A semiconductor memory device comprising:

a plurality of word lines and a plurality of bit lines intersected by said plurality of word lines; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact area to the storage electrode of the capacitor;

a memory cell pair being formed by two nearby memory cells and these two memory cells of the memory cell pair having a common bit line contact;

wherein a bit line contact of a memory cell pair which is connected to a bit line and a bit line contact of a memory cell pair which is connected to a bit line adjacent in one side of said bit line are arranged on opposite sides of two adjacent word lines, bit line contacts of memory cell pairs which are connected to a bit line adjacent to the other side of said bit line are arranged on opposite sides of a word line, wherein directions of units of the memory cell pairs connected to a bit line are arranged non-parallel with directions of units of the memory cell pairs connected to a bit line adjacent to one side of the bit line, and are arranged in parallel with directions of units of the memory cell pairs connected to a bit line adjacent to the other side of the bit line, and wherein a first bit line contact is connected to a first bit line, a second bit line contact is connected to a second bit line which is adjacent to said first bit line, wherein only two word lines disposed between said first and second bit line contacts, and a third bit line contact is connected to a third bit line which is adjacent to said second bit line, and wherein only one word line is disposed between said second and third bit line contacts.

5. A device according to claim 4, wherein a storage capacitor is formed above the bit line.

6. A device according to claim 4, wherein a bit line is formed above the storage capacitor.

7. A semiconductor memory device comprising:

a plurality of word lines and a plurality of bit lines intersected by said plurality of word lines, each of said plurality of word lines being separated by a predetermined distance; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact to the storage electrode of the capacitor;

a memory cell pair being formed by two nearby memory cells and these two memory cells of the memory cell having a common bit line contact;

wherein bit line contacts are arranged on one bit line of a bit line pair connected to a same sense amplifier, memory cell pairs connected to a bit line with two word lines therebetween, and the position of a bit line contact of a bit line connected to a next sense amplifier is displaced along the bit line by a distance equal to the predetermined distance with regard to the position of a bit line contact of a bit line connected to a preceding sense amplifier.

8. A device according to claim 7, wherein two memory cells constituting a memory cell pair connected to a bit line are arranged on both sides of the bit line.

9. A device according to claim 8, wherein the directions of the units of the memory cell pairs connected to a bit line are arranged in parallel with each other and obliquely with regard to the bit line.

10. A device according to claim 8, wherein the directions of the units of the memory cell pairs connected to a bit line are arranged to be non-parallel with the directions of the units of the memory cell pairs connected to the second adjacent bit line.

11. A device according to claim 7, wherein the two memory cells constituting a memory cell pair connected to a bit line are arranged on one side of the bit line, and the two memory cells constituting memory cell pairs placing two word lines therebetween are arranged on both sides of the bit line.

12. A device according to claim 11, wherein a memory cell pair connected to a bit line is in a T shape or in a V shape having a bit line contact point at the center thereof.

13. A device according to claim 7, wherein the device is divided into a first range of memory cell array in which the memory cell pairs are connected to a bit line and a second range of memory cell array in which the memory cell pairs are connected to a bit line adjacent to the above-mentioned bit line.

14. A semiconductor memory device comprising:

a plurality of word lines and a plurality of bit lines intersected by said plurality of word lines; and a plurality of memory cells located at intersections of the word lines and the bit lines, each of said memory cells comprising a capacitor for storing information and a transfer transistor for reading information from and writing information into the capacitor, the gate of said transfer transistor being connected to a word line, the source of said transfer transistor being connected through a bit line contact to a bit line, the drain of said transfer transistor being connected through a storage capacitor contact to the storage electrode of the capacitor;

a memory cell pair being formed by two nearby memory cells and these two memory cells of the memory cell pair having a common bit line contact;

wherein a first bit line contact is connected to a first bit line, a second bit line contact is connected to a second bit line which is adjacent to said first bit line, wherein only two word lines are disposed between said first and second bit line contacts, and a third bit line contact is connected to a third bit line which is adjacent to said second bit line, and wherein only one word line is disposed between said second and third bit line contacts.

15. A device according to claim 14, wherein the memory cell pair is arranged in a direction parallel with the bit line.

16. A device according to claim 15, wherein the memory cell pair has a "T" configuration with the bottom point thereof above the bit line, and is positioned in the portion shifted from the bit line.

* * * * *

UNITED STATES PATENT AND TRADEMARK OFFICE
CERTIFICATE OF CORRECTION

PATENT NO. : 5,812,444

DATED : September 22, 1998

INVENTOR(S) : Ema et al.

It is certified that error appears in the above-identified patent and that said Letters Patent is hereby corrected as shown below:

On the title page:
    Insert -- [30] Foreign Priority Data

Aug. 19, 1989    Japan    01-213426
        March 20, 1990   Japan    02-070006 --

Signed and Sealed this

Seventh Day of September, 1999

Attest:

Q. TODD DICKINSON

*Attesting Officer*      *Acting Commissioner of Patents and Trademarks*